US011789042B2

(12) United States Patent
Kast et al.

(10) Patent No.: US 11,789,042 B2
(45) Date of Patent: *Oct. 17, 2023

(54) ENERGY HARVEST SPLIT CORE DESIGN ELEMENTS FOR EASE OF INSTALLATION, HIGH PERFORMANCE, AND LONG TERM RELIABILITY

(71) Applicant: Sentient Technology Holdings, LLC, Wichita, KS (US)

(72) Inventors: Michael Kast, Palo Alto, CA (US); David P. Knight, Mountain View, CA (US); Mark A. Parsons, Colorado Springs, CO (US); Dennis Allen Saxby, Los Gatos, CA (US)

(73) Assignee: Sentient Technology Holdings, LLC, Wichita, KS (US)

(*) Notice: Subject to any disclaimer, the term of this patent is extended or adjusted under 35 U.S.C. 154(b) by 90 days.

This patent is subject to a terminal disclaimer.

(21) Appl. No.: 17/155,875

(22) Filed: Jan. 22, 2021

(65) Prior Publication Data

US 2021/0141003 A1 May 13, 2021

Related U.S. Application Data

(63) Continuation of application No. 14/987,664, filed on Jan. 4, 2016, now Pat. No. 10,901,008, which is a (Continued)

(51) Int. Cl.
*G01R 15/18* (2006.01)
*G01R 21/00* (2006.01)
(Continued)

(52) U.S. Cl.
CPC ............. *G01R 15/186* (2013.01); *G01R 1/22* (2013.01); *G01R 21/00* (2013.01); *H01F 27/23* (2013.01);
(Continued)

(58) Field of Classification Search
None
See application file for complete search history.

(56) References Cited

U.S. PATENT DOCUMENTS 3,075,166 A 1/1963 Peek
3,558,984 A 1/1971 Smith
(Continued)

FOREIGN PATENT DOCUMENTS

BY 2116 U * 9/2005 ............. G01R 11/00
DE 4336849 C1 * 1/1995 ......... H01R 13/5216
(Continued)

OTHER PUBLICATIONS

Chen et al., "Development of arc-guided protection devices against lightning breakage of covered conductors on distribution lines", IEEE Trans. Power Deliv.; 25(1); pp. 196-205; Jan. 2010.
(Continued)

*Primary Examiner* — Patrick Assouad
*Assistant Examiner* — Haidong Zhang

(57) ABSTRACT

A power distribution monitoring system is provided that can include a number of features. The system can include a plurality of power line sensing devices configured to attach to individual conductors on a power grid distribution network. In some embodiments, the power line sensors can include a split-core transformer. In some embodiments, a power line sensing device is disposed on each conductor of a three-phase network. The sensing devices can be configured to measure and monitor, among other things, current and electric-field on the conductors. Methods of installing, sealing, and protecting the split-core transformers of the power line sensors are also discussed.

20 Claims, 22 Drawing Sheets

Related U.S. Application Data continuation of application No. 13/733,745, filed on Jan. 3, 2013, now Pat. No. 9,229,036.

(60) Provisional application No. 61/582,739, filed on Jan. 3, 2012.

(51) Int. Cl.

| | | |
|---|---|---|
| *H01R 43/26* | (2006.01) | |
| *G01R 1/22* | (2006.01) | |
| *H01R 43/00* | (2006.01) | |
| *H01F 38/30* | (2006.01) | |
| *H01F 27/23* | (2006.01) | |
| *H01F 38/14* | (2006.01) | |
| *H01R 4/28* | (2006.01) | |
| *G01R 31/08* | (2020.01) | |
| *G01R 15/14* | (2006.01) | |

(52) U.S. Cl.
CPC ............ *H01F 38/14* (2013.01); *H01F 38/30* (2013.01); *H01R 4/28* (2013.01); *H01R 43/002* (2013.01); *H01R 43/26* (2013.01); *G01R 15/14* (2013.01); *G01R 31/085* (2013.01); *H01F 2038/305* (2013.01); *Y10T 29/49117* (2015.01)

(56) References Cited

U.S. PATENT DOCUMENTS

| | | |
|---|---|---|
| 3,676,740 A | 7/1972 | Schweitzer, Jr. |
| 3,686,531 A | 8/1972 | Decker |
| 3,702,966 A | 11/1972 | Schweitzer, Jr. |
| 3,708,724 A | 1/1973 | Schweitzer |
| 3,715,742 A | 2/1973 | Schweitzer |
| 3,720,872 A | 3/1973 | Russell |
| 3,725,832 A | 4/1973 | Schweitzer |
| 3,755,714 A | 8/1973 | Link |
| 3,768,011 A | 10/1973 | Swain |
| 3,777,217 A | 12/1973 | Groce |
| 3,814,831 A | 6/1974 | Olsen |
| 3,816,816 A | 6/1974 | Schweitzer |
| 3,866,197 A | 2/1975 | Schweitzer, Jr. |
| 3,876,911 A | 4/1975 | Schweitzer, Jr. |
| 3,957,329 A | 5/1976 | McConnell |
| 3,970,898 A | 7/1976 | Baumann |
| 4,063,161 A | 12/1977 | Pardis |
| 4,152,643 A | 5/1979 | Schweitzer, Jr. |
| 4,339,792 A | 7/1982 | Yasumura |
| 4,378,525 A | 3/1983 | Burdick |
| 4,396,794 A | 8/1983 | Stiller |
| 4,396,968 A | 8/1983 | Stiller |
| 4,398,057 A | 8/1983 | Shankle |
| 4,408,155 A | 10/1983 | Mcbride |
| 4,466,071 A | 8/1984 | Russell, Jr. |
| 4,559,491 A | 12/1985 | Saha |
| 4,570,231 A | 2/1986 | Bunch |
| 4,584,523 A | 4/1986 | Elabd |
| 4,649,457 A | 3/1987 | Talbot |
| 4,654,573 A | 3/1987 | Rough |
| 4,709,339 A | 11/1987 | Fernandes |
| 4,714,893 A | 12/1987 | Smith-vaniz |
| 4,723,220 A | 2/1988 | Smith-vaniz |
| 4,728,887 A | 3/1988 | Davis |
| 4,746,241 A | 5/1988 | Burbank, III |
| 4,766,549 A | 8/1988 | Schweitzer |
| 4,775,839 A | 10/1988 | Kosina |
| 4,794,328 A * | 12/1988 | Fernandes ......... H02J 13/00034 374/E1.004 |
| 4,808,916 A | 2/1989 | Smith-vaniz |
| 4,827,272 A | 5/1989 | Davis |
| 4,829,298 A | 5/1989 | Fernandes |
| 4,881,028 A | 11/1989 | Bright |
| 4,886,980 A | 12/1989 | Fernandes |
| 4,904,932 A | 2/1990 | Schweitzer, Jr. |
| 4,937,769 A | 6/1990 | Verbanets |
| 5,006,846 A | 4/1991 | Granville |
| 5,125,738 A | 6/1992 | Kawamura |
| 5,138,265 A | 8/1992 | Kawamura |
| 5,159,561 A | 10/1992 | Watanabe |
| 5,181,026 A | 1/1993 | Granville |
| 5,182,547 A | 1/1993 | Griffith |
| 5,202,812 A | 4/1993 | Shinoda |
| 5,206,595 A | 4/1993 | Wiggins |
| 5,220,311 A | 6/1993 | Schweitzer, Jr. |
| 5,428,549 A | 6/1995 | Chen |
| 5,438,256 A | 8/1995 | Thuries |
| 5,473,244 A | 12/1995 | Libove |
| 5,495,169 A | 2/1996 | Smith |
| 5,550,476 A | 8/1996 | Lau |
| 5,556,299 A | 9/1996 | Finke |
| 5,565,783 A | 10/1996 | Lau |
| 5,600,248 A | 2/1997 | Westrom |
| 5,608,328 A | 3/1997 | Sanderson |
| 5,650,728 A | 7/1997 | Rhein |
| 5,656,931 A | 8/1997 | Lau |
| 5,682,100 A | 10/1997 | Rossi |
| 5,696,788 A | 12/1997 | Choi |
| 5,712,796 A | 1/1998 | Ohura |
| 5,729,144 A | 3/1998 | Cummins |
| 5,737,203 A | 4/1998 | Barrett |
| 5,764,065 A | 6/1998 | Richards |
| 5,839,093 A | 11/1998 | Novosel |
| 5,892,430 A | 4/1999 | Wiesman |
| 5,905,646 A | 5/1999 | Crewson |
| 5,990,674 A | 11/1999 | Schweitzer, Jr. |
| 6,002,260 A | 12/1999 | Lau |
| 6,016,105 A | 1/2000 | Schweitzer, Jr. |
| 6,043,433 A | 3/2000 | Schweitzer, Jr. |
| 6,133,723 A | 10/2000 | Feight |
| 6,133,724 A | 10/2000 | Schweitzer, Jr. |
| 6,214,123 B1 * | 4/2001 | Gardner ............... C23C 16/4409 118/724 |
| 6,288,632 B1 | 9/2001 | Hoctor |
| 6,292,340 B1 | 9/2001 | Oregan |
| 6,347,027 B1 | 2/2002 | Nelson |
| 6,433,698 B1 | 8/2002 | Schweitzer, Jr. |
| 6,459,998 B1 | 10/2002 | Hoffman |
| 6,466,030 B2 | 10/2002 | Hu |
| 6,466,031 B1 | 10/2002 | Hu |
| 6,477,475 B1 | 11/2002 | Takaoka |
| 6,483,435 B2 | 11/2002 | Saha |
| 6,549,880 B1 | 4/2003 | Willoughby |
| 6,559,651 B1 | 5/2003 | Crick |
| 6,566,854 B1 | 5/2003 | Hagmann |
| 6,577,108 B2 | 6/2003 | Hubert |
| 6,601,001 B1 | 7/2003 | Moore |
| 6,622,285 B1 | 9/2003 | Rust |
| 6,677,743 B1 | 1/2004 | Coolidge |
| 6,718,271 B1 | 4/2004 | Tobin |
| 6,734,662 B1 | 5/2004 | Fenske |
| 6,798,211 B1 | 9/2004 | Rockwell |
| 6,822,457 B2 | 11/2004 | Borchert |
| 6,822,576 B1 | 11/2004 | Feight |
| 6,879,917 B2 | 4/2005 | Turner |
| 6,894,478 B1 | 5/2005 | Fenske |
| 6,914,763 B2 | 7/2005 | Reedy |
| 6,917,888 B2 | 7/2005 | Logvinov |
| 6,927,672 B2 | 8/2005 | Zalitzky |
| 6,949,921 B1 | 9/2005 | Feight |
| 6,963,197 B1 | 11/2005 | Feight |
| 6,980,090 B2 | 12/2005 | Mollenkopf |
| 7,023,691 B1 | 4/2006 | Feight |
| 7,046,124 B2 | 5/2006 | Cope |
| 7,053,601 B1 | 5/2006 | Fenske |
| 7,072,163 B2 | 7/2006 | McCollough, Jr. |
| 7,076,378 B1 | 7/2006 | Huebner |
| 7,085,659 B2 | 8/2006 | Peterson |
| 7,106,048 B1 | 9/2006 | Feight |
| 7,158,012 B2 | 1/2007 | Wiesman |
| 7,187,275 B2 | 3/2007 | McCollough, Jr. |
| 7,203,622 B2 | 4/2007 | Pan |
| 7,272,516 B2 | 9/2007 | Wang |
| 7,295,133 B1 | 11/2007 | McCollough, Jr. |

(56) References Cited

U.S. PATENT DOCUMENTS

| | | |
|---|---|---|
| 7,400,150 B2 | 7/2008 | Cannon |
| 7,424,400 B2 | 9/2008 | McCormack |
| 7,449,991 B2 | 11/2008 | Mollenkopf |
| 7,450,000 B2 | 11/2008 | Gidge |
| 7,508,638 B2 | 3/2009 | Hooper |
| 7,518,529 B2 | 4/2009 | Osullivan |
| 7,532,012 B2 | 5/2009 | Cern |
| 7,557,563 B2 | 7/2009 | Gunn |
| 7,626,794 B2 | 12/2009 | Swartzendruber |
| 7,633,262 B2 | 12/2009 | Lindsey |
| 7,672,812 B2 | 3/2010 | Stoupis |
| 7,683,798 B2 | 3/2010 | Rostron |
| 7,701,356 B2 | 4/2010 | Curt |
| 7,714,592 B2 | 5/2010 | Radtke |
| 7,720,619 B2 | 5/2010 | Hou |
| 7,725,295 B2 | 5/2010 | Stoupis |
| 7,742,393 B2 | 6/2010 | Bonicatto |
| 7,764,943 B2 | 7/2010 | Radtke |
| 7,795,877 B2 | 9/2010 | Radtke |
| 7,795,994 B2 | 9/2010 | Radtke |
| 7,804,280 B2 | 9/2010 | Deaver, Sr. |
| 7,930,141 B2 | 4/2011 | Banting |
| 8,421,444 B2 | 4/2013 | Gunn |
| 8,497,781 B2 | 7/2013 | Engelhardt |
| 8,594,956 B2 | 11/2013 | Banting |
| 8,786,292 B2 | 7/2014 | Parsons |
| 9,182,429 B2 | 11/2015 | Saxby |
| 9,229,036 B2 | 1/2016 | Kast |
| 9,954,354 B2 | 4/2018 | Baker |
| 10,634,733 B2 | 4/2020 | Saxby |
| 2004/0156154 A1 | 8/2004 | Lazarovich |
| 2005/0073200 A1 | 4/2005 | Divan |
| 2006/0279910 A1 | 12/2006 | Gunn |
| 2008/0077336 A1 | 3/2008 | Fernandes |
| 2009/0058582 A1 | 3/2009 | Webb |
| 2009/0309754 A1 | 12/2009 | Bou |
| 2010/0085036 A1 | 4/2010 | Banting |
| 2011/0032739 A1 | 2/2011 | Juhlin |
| 2012/0039062 A1 | 2/2012 | Mcbee |
| 2012/0139554 A1 | 6/2012 | Parsons |
| 2012/0236611 A1 | 9/2012 | Alexandrov |
| 2013/0162136 A1 | 6/2013 | Baldwin |
| 2013/0187637 A1 | 7/2013 | Saxby |
| 2014/0062221 A1 | 3/2014 | Papastergiou |
| 2014/0145858 A1 | 5/2014 | Miller |
| 2014/0174170 A1 | 6/2014 | Davis |
| 2014/0226366 A1 | 8/2014 | Morokuma |
| 2016/0069934 A1 | 3/2016 | Saxby |
| 2017/0162320 A1 | 6/2017 | Rumrill |
| 2020/0088772 A1 | 3/2020 | Rumrill |
| 2020/0088779 A1 | 3/2020 | Rumrill |
| 2020/0091721 A1 | 3/2020 | Rumrill |

FOREIGN PATENT DOCUMENTS

| | | | |
|---|---|---|---|
| EP | 1508146 A2 | 2/2005 | |
| EP | 2350764 A4 | 11/2013 | |
| EP | 1938159 B1 | 8/2016 | |
| EP | 2340592 B1 | 11/2019 | |
| EP | 3832822 A1 * | 6/2021 | ............... H02G 1/02 |

OTHER PUBLICATIONS

Chen Yang Technologies, "Split core hall effect dc current sensor CYHCT-C2TC", 4 pages; retrieved from the internet Jan. 5, 2015 (http://www.hallsensors.de/CYHCT-C2TC.pdf) (Product Information).

Saha et al., "Fault Location on Power Networks (Power Systems)", Springer Verlag; London, UK; 435 pgs.; 2010 (Preface: Oct. 2009).

Shepard et al., "An overview of rogowski coil current sensing technology", 13 pages; retrieved from the internet Jan. 5, 2016 (http://www.dynamp.net/ldadocum.nsf/c2270fbdd892ac3e86256e75000ad88a/e710-af6d3e0f6255862565d7004b19db/$FILE/Report.pdf).

Stringfield et al., Fault location methods for overhead lines; in Transactions of the American Institute of Electrical Engineers; Amer. Inst. of Electrical Eng.; New York, NY; Part III; vol. 76; pp. 518-530; Aug. 1957.

* cited by examiner

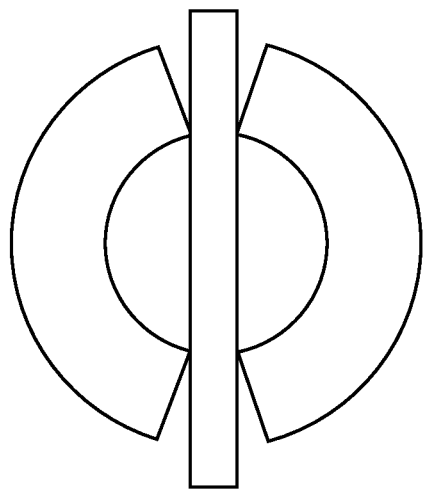
FIG. 13C +50°C
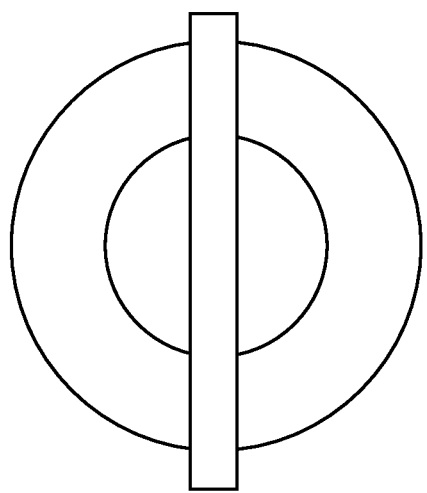
FIG. 13B POLISH TEMP
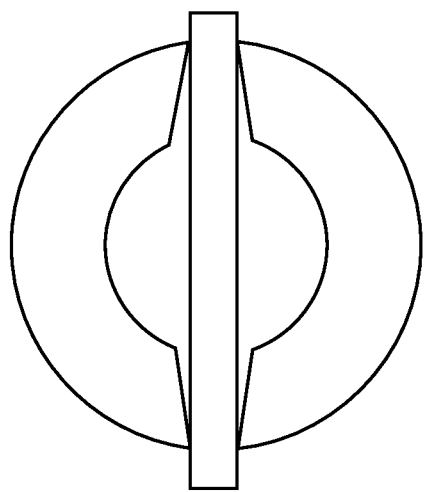
FIG. 13A −50°C

ENERGY HARVEST SPLIT CORE DESIGN ELEMENTS FOR EASE OF INSTALLATION, HIGH PERFORMANCE, AND LONG TERM RELIABILITY

CROSS REFERENCE TO RELATED APPLICATIONS

This application is a continuation of U.S. patent application Ser. No. 14/987,664, filed Jan. 4, 2016, which is a continuation of U.S. patent application Ser. No. 13/733,745, filed Jan. 3, 2013, now U.S. Pat. No. 9,229,036, which application claims the benefit under 35 U.S.C. 119 of U.S. Provisional Patent Application No. 61/582,739, filed Jan. 3, 2012, titled "Energy Harvest Split Core Design Elements for Ease of Installation, High Performance, and Long Term Reliability", which applications are incorporated by reference as if fully set forth herein.

INCORPORATION BY REFERENCE

All publications and patent applications mentioned in this specification are herein incorporated by reference to the same extent as if each individual publication or patent application was specifically and individually indicated to be incorporated by reference.

FIELD

This disclosure generally relates to power line sensors. More specifically, this disclosure covers power line sensors with robust energy harvesting designs that allow for long term reliability and performance in challenging environmental conditions.

BACKGROUND

Numerous examples of prototype and commercially available line sensors derive power form a primary cell storage battery that both limits and defines operational and communications availability (examples include SEL fault current indicators). A limited number of line sensors may include rechargeable cells harvesting solar energy and/or the electromagnetic field of the conductor to extend operational and communications availability (GridSentry and others).

Harvesting energy from the electromagnetic field in the proximity of the conductor can be engineered with magnetic cores around the conductor, capturing the magnetic field created by line current flow and transforming it to an AC voltage. Split-core toroidal transformers can be mounted around a conductor, eliminating the need to cut and splice the conductors. The design of split-core transformers for general use as power current measurement devices is routine for applications in mild environmental conditions. However, successful implementation of environmentally robust split-core transformers satisfying the full range of product requirements provides additional challenges due to extreme weather and environmental elements that can degrade the performance and lifetime of split-core transformers.

SUMMARY OF THE DISCLOSURE

In some embodiments, a power line sensing device comprises a split-core transformer comprising a first core half and a second core half, the split-core transformer configured to harvest energy from a power line conductor, a clamping mechanism configured to join the first core half to the second core half around the power line conductor, a spring configured to apply a force against the power line conductor to press the power line conductor against the split-core transformer, and electronics configured to receive energy harvested from the split-core transformer to power the power line sensing device.

In one embodiment, the clamping mechanism comprises a hard stop mechanism arranged around at least a part of the first core half and a screw configured to apply pressure to the second core half. In another embodiment, the clamping mechanism further comprises an opening in the screw configured to receive a lineman's hot-stick, wherein rotation of the hot-stick advances the screw into the second core half.

In some embodiments, the sensing device further comprises a grip pad disposed on an interior of the split-core transformer, the grip pad configured to increase friction between the split-core transformer and the power line conductor.

In an additional embodiment, the clamping mechanism comprises a band clamp configured to surround a perimeter of the split-core transformer.

In another embodiment, a power line sensing device is provided, comprising a split-core transformer comprising a first core half and a second core half, the split-core transformer configured to harvest energy from a power line conductor, a first perimeter seal disposed around a first core face of the first core half, and a second perimeter seal disposed around a second core face of the second core half, the first and second perimeter seals configured to join together to seal the first and second core faces off from contaminants, and electronics configured to receive energy harvested from the split-core transformer to power the power line sensing device.

In some embodiments, the first and second perimeter seals form an o-ring seal around the first and second core faces.

In another embodiment, the first and second perimeter seals encircle both an interior perimeter and an external perimeter of the first and second core faces.

Another power line sensing device is provided, comprising a split-core transformer comprising a first core half and a second core half, the split-core transformer configured to harvest energy from a power line conductor, electronics configured to receive energy harvested from the split-core transformer to power the power line sensing device, a reservoir disposed in a first core face of the first core half, the reservoir at least partially filled with a sealing material; and a pin disposed on a second core face of the second core half, the pin sized and configured to fit inside the reservoir to release the sealing material when the split-core transformer is closed around the power line conductor.

In some embodiments, the sealing material comprises a fluid, wax, or paste. In another embodiment, the sealing material is configured to hermetically seal the first and second core halves of the split-core transformer.

A method of installing a power line sensor on a power line conductor is also provided, comprising attaching a lineman's hot-stick tool to a clamping mechanism of the power line sensor, passing a split-core transformer of the power line sensor over the power line conductor, rotating the lineman's hot-stick tool to actuate the clamping mechanism and close the split-core transformer around the power line sensor.

BRIEF DESCRIPTION OF THE DRAWINGS

The novel features of the invention are set forth with particularity in the claims that follow. A better understanding of the features and advantages of the present invention will be obtained by reference to the following detailed description that sets forth illustrative embodiments, in which the principles of the invention are utilized, and the accompanying drawings of which:

FIGS. 13A-13C describe the core interface gap of a typical tape wound split-core transformer under different soak temperatures.

DETAILED DESCRIPTION

Figure 1:
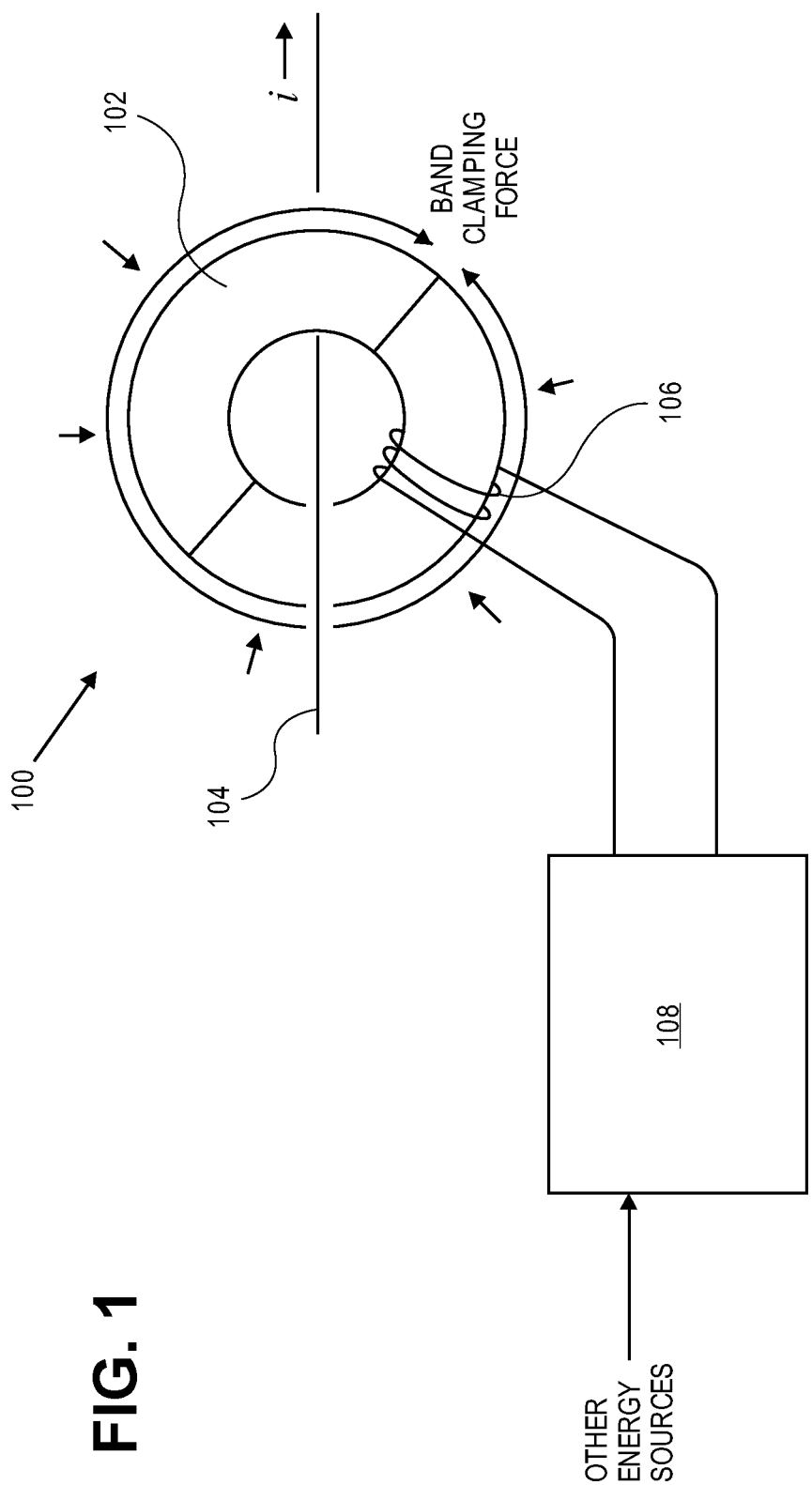
FIG. 1 describes the overall relationship of power harvesting, electronics, energy storage, and mechanical structures in a power line monitor.

Power line sensors used in electric power distribution applications are subjected to the full extent of possible environmental conditions over many years of unattended operation. The devices are required to be small and reasonably lightweight, while mechanically and electrically robust. Protecting the electronic components from environmental stresses is critical for long product life, but conventional methods of constructing outdoor enclosures do not satisfy the full range of requirements. Difficult to survive environmental conditions including driving rain which can result in liquid water in proximity to gapped interfaces which then wick the moisture into sensitive areas, marine environments where salts are deposited and concentrated over time on housings resulting in an exceptionally corrosive environment for most metals, and freezing conditions where liquid water can freeze and apply mechanical loads on mechanisms. The complexity of installation on energized lines dictates the need for mechanical details which minimize the number of installers and tools required to complete a sensor placement. The need to remove failed devices in various states of operation can require features that are necessary only in those cases. Application specific designs and construction details are required to satisfy these and other situations.

Power line sensors systems described herein can be configured to measure the currents and voltages of power grid distribution networks. In some embodiments, power line sensors can be mounted to each power line conductor of a power distribution network. The power distribution network can be a three phase AC network, or alternatively, a single-phase network, for example. The power distribution network can be any type of network, such as a 60 Hz North American network, or alternatively, a 50 Hz network such as is found in Europe and Asia, for example. Power distribution networks, such as in the United States, typically operate at a medium voltage (e.g., 4 kV to 46 kV or higher) to reduce the energy lost during transmission over long distances. The monitoring devices can also be used on high voltage "transmission lines" or conductors that operate at voltages higher than 46 kV.

As described above, power line sensors can be mounted on each conductor of a three-phase network and can be configured to monitor, among other things, current values and waveforms, conductor temperatures, ambient temperatures, vibration, wind speed and monitoring device system diagnostics. In some embodiments, a fourth sensor can be mounted on the ground conductor associated with the three phase lines. The monitoring devices can measure current in peak amplitude or root-mean-square (RMS) values and waveforms with, for example, with Rogowski coils, Hall-effect sensors, current transformers, or other similar current measurement devices.

In additional embodiments, multiple sensors can be used on a single phase line. The monitoring devices can be mounted quickly and easily via a hot stick, and can harvest energy from the power lines for operation or be self powered (e.g., include batteries or solar panels). The monitoring devices can further include wireless transmission and receiving capabilities for communication with a central server and for communications between each monitoring device. Installation of a three monitoring device array can be placed and configured by a single linesman with a hot-stick and a bucket truck in less than 20 minutes. Monitoring device communication with the installation crew can be enabled during the installation process to provide immediate verification of successful installation.

In some embodiments, the power line sensors can incorporate electronics that include sensors and hardware configured to measure current on the conductors and the electric field surrounding the conductors, can record and analyze power factor signatures, fault event signatures, and classify event waveforms. Current and electric field waveform signatures can be monitored and catalogued by the monitoring devices to build a comprehensive database of events, causes, and remedial actions. In some embodiments, an application executed on a central server can provide waveform and event signature cataloguing and profiling for access by the monitoring devices and by utility companies. This system can provide fault localization information with remedial action recommendations to utility companies, pre-emptive equipment failure alerts, and assist in power quality management of the distribution grid.

The electronics of the power line sensors described herein can comprise sensing elements, a power supply, a battery, a microprocessor board, a CPU, and high powered communication systems including transmit and receive capabilities, disposed within a robust mechanical housing designed for severe service conditions. The monitoring devices can be configured to withstand temperatures ranging from −40 to +85 C, EMI and ESD immunity, current and voltage impulse resistance, and driving rain and salt fog survival. The monitoring devices can also be configured to operate at up to 1000 A operating current, monitor fault currents up to 10 kA, with full functionality with a lifespan of at least 10 years in the field.

The monitoring devices can be configured to communicate through a distribution network, such as through the Silver Spring Network or any similar radio network technology, to transmit measured data such as current, electric field, fault signatures, and event waveforms. When mounted to typical power grid distribution networks, the monitoring devices can be mounted at approximately 30 feet above ground level and typically above tree tops, providing for a very substantial effective range of communication. In addition to two-way network communications for data packets and setting operational setpoints, the monitoring devices can be configured for wireless device firmware upgrades for long term functionality.

As described above, the power line sensors can be configured to gain the performance and information-rich benefits equivalent to having direct voltage data by measuring the electric field surrounding a power grid distribution network instead. For electric field sensing, the sensing elements can comprise any type of electrometer, such as a "field chopping" transducer, capacitive sensing plate with charge amplifier (CCA), or piezoelectric crystals to measure electric field. Further details on the power line sensors that will be discussed in this application can be found in Applicant's co-owned Patent Pub. No. 2012/0139554, titled "Power Conductor Monitoring Device and Method of Calibration", filed Dec. 6, 2011, now U.S. Pat. No. 8,786,292.

FIG. 1 is a schematic drawing of a power line sensor 100 comprising a split-core transformer 102 disposed around a power line 104, the split-core transformer serving as a magnetic field energy harvesting feature for self-powering the sensor 100 with energy harvested from the line. Current, i(t), flowing in the line creates a magnetic field inducing magnetic flux in the transformer core. A secondary wire winding 106 around the core can produce AC voltage or current that can be coupled to electronics 108 for the storage and creation of voltages to operate sensor and measurement circuits.

The electronics 108 can include all the electronic sensors, hardware, and software needed to measure current on the conductors and the electric field surrounding the conductors, record and analyze power factor signatures, fault event signatures, and classify event waveforms. The electronics can also include all communications equipment, antennas, transmitters, and receivers necessary to transmit measured and processed data external to the power line sensor. The electronics can also include energy storage mechanisms, such as batteries, capacitors, etc. Additionally, the electronics 108 can be coupled to other energy sources (e.g., an external battery battery) to provide power to the power line sensor in the event that the energy harvesting feature is incapable or insufficient to power the sensor. Some or all of the components of the power line sensor 100, including the described above can be enclosed in a hermetic housing (not shown).

In order to install a power line sensor having a current transformer onto an overhead conductor, a split-core transformer design must be used. As shown in FIG. 1, a split-core transformer can be clamped or forced together around a conductor after installation to minimize the gap length between split-cores of the core reluctance path thereby improving the energy harvesting capability. Tape wound cores typically provide the greatest energy harvest capability but are particularly sensitive to the clamping force being uniformly distributed about the core for an even force application.

Certain embodiments discussed below will describe aspects of various power line sensors. It should be understood that many embodiments described and illustrated herein can include any of the aspects of the power line sensor described in FIG. 1, such as the electronics, energy harvesting and storage features, sensing features, and housing described above.

Figure 2:
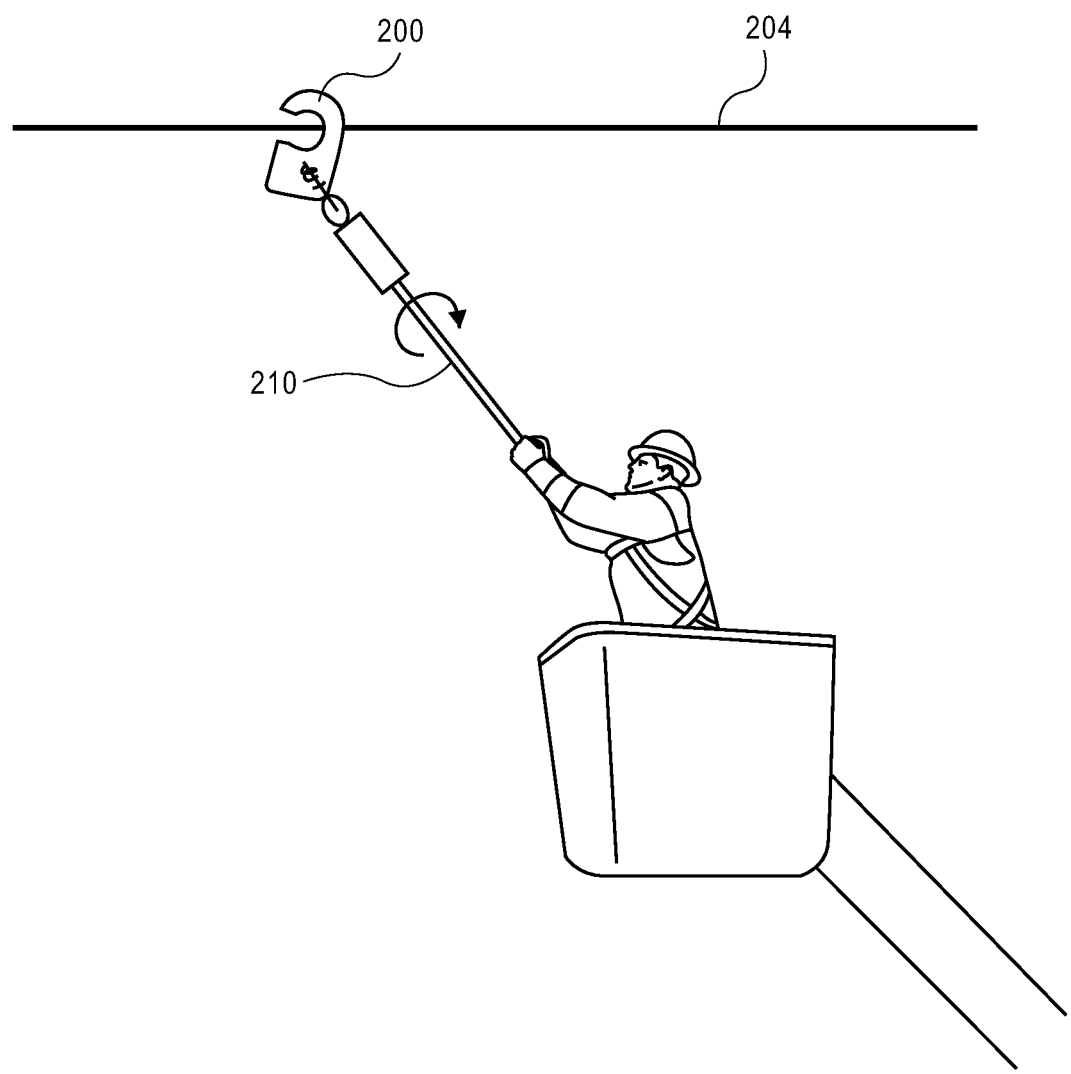
FIG. 2 describes a line mounted sensor with split-core power harvesting suitable for deployment by a single installer equipped with a single "shotgun hotstick" from a utility bucket truck.

A line powered sensor or monitor can benefit by being easy to install and requiring only a minimum of time and personnel for installation. Referring to FIG. 2, it is desirable that the sensor 200 be light enough to be mounted on a power line 204 using a standard "shotgun hotstick" lineman's tool 210 and handled by a single installer from a bucket truck. Installation time is an important factor for financially successful deployments of sensor arrays due to the high cost of crew time and supporting equipment. Although gloved installation is a proven process and allows close visual inspection of the conductor surface and final installation, hot stick installation is the standard required by most utility customers. In addition to a fast mechanical installation, minimized time on location also requires quick confirmation of proper core closure, system operation, and network connectivity.

Figure 3:
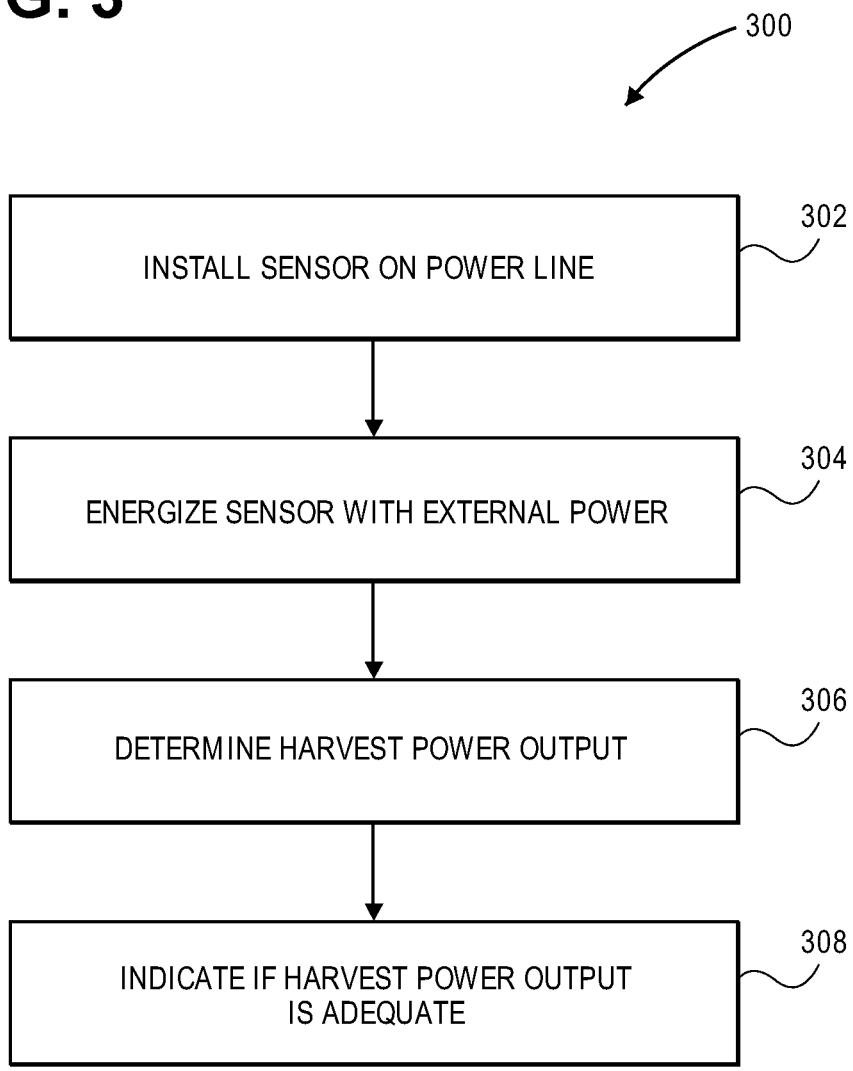
FIG. 3 shows device software which monitors and reports core energy harvesting performance and provides early information on degraded core face conditions.

The desire to minimize installer time can be aided by the availability of installer accessible information from the sensor that the device has been correctly installed. FIG. 3 illustrates a flowchart 300 of one method for installing a power line sensor of the present invention. At step 302 of flowchart 300, the power line sensor can be installed onto the power line, such as using the method described above in FIG. 2.

Next, at step 304, the power line sensor can be energized with an external power source, such as a battery. At step 306 of flowchart 300, the power line sensor can measure current flowing through the power line and determine a harvest power output of the installed power line sensor and compare it against the power expected at the measured line current. Line current can be measured in one of several ways; using the split current transformer itself as a current transducer before reverting it to power harvesting, use a Rogowski coil current sensor, Hall effect sensor, etc. The harvest power output can be compared with a lookup table to determine if the harvest power output is sufficient. This method can determine when a line mounted sensor is properly installed on the power line and able to self-power from energy harvested from the line.

Finally, at step 308, the power line sensor can indicate whether or not the harvested power available is sufficient to self-power the power line sensor. This indication can be, for example, visual, audible, vibratory, or some combination thereof. For example, if the harvest power output is low or there is no power, then the line sensor can give audible or visual feedback to the installer that the harvest power is insufficient. Similarly, if the harvest power is proper, then a different audible or visual signal can be transmitted to the installer. For example, a sequence of short flashes from a light on the sensor can indicate that harvest power output is insufficient, and a sequence of long flashes from the light can indicate that the harvest power is sufficient. Similarly, the power line sensor can include a display device or screen to visually indicate to the installer whether or not the harvest power is sufficient (e.g., with color, text, or pictures).

Figure 4:
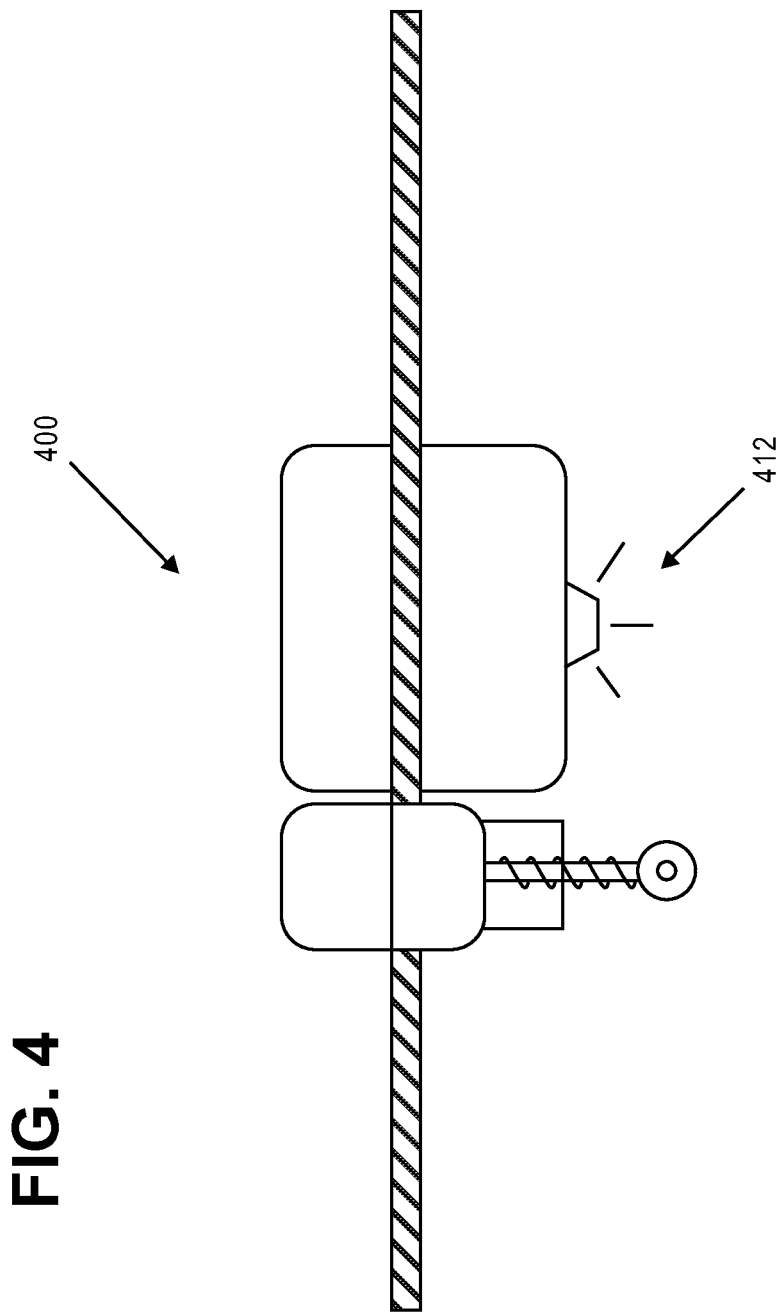
FIG. 4 illustrates a split-core communicating device indicating adequate performance on closure to the installing linesman.

As described above, the power line sensors can include an optical indication of acceptable energy harvesting, which can be indicated by a repeating flashing light 412 on the line sensor 400 and visible to the installer, as shown in FIG. 4. The pattern can repeat frequently and for a period long enough for the installer to easily observe the light pattern.

The use of a split-core transformer to harvest energy on a power conductor is a viable method for powering ungrounded devices. In one embodiment, the installation of a split-core transformer requires that the faces of the split-core transformers meet with an exceptionally small magnetic gap, on the order of 0.001" or less. To achieve a gap this small, there must be a contaminant free face closure to provide maximum flux capture and a minimal reluctance path. Maintaining high power output of the split-core requires that the gap remains exceptionally small over time. Corrosion of the split-core faces can significantly increase the effective gap and is probably the dominant mode of output reduction over time in real systems. As corrosion products such as oxides are generated, those oxides can overcome clamping forces and drive the core faces apart in a fashion similar to how water in the gap can freeze and separate the faces due to the larger volumes of ice vs. water.

Split-core transducers according to the present disclosure can achieve close tolerance with polished core faces that minimize the effective gap between faces, but also enables liquid water wicking into the gap space, making it particularly difficult to ensure that moisture is not introduced to the interface. Further, a pumping effect due to both thermal variations and barometric pressure can drive moisture across a good but not hermetic perimeter seal.

Highly efficient harvest cores are generally of the "tape wound" variety. While gap reduction through clamping is important, point load forces can also deform and even delaminate the structure, resulting in degraded performance.

In some embodiments, the operation of closing the core faces can be a fixed geometry process, as the core can be considered rigid in the first approximation. Clamping of the sensor assembly onto the overhead conductor is a variable geometry process as conductor diameters range from approximately 0.25" to over 1.0". Defining a single installer and single hot stick installation is then best accommodated by a mechanism with dual travel and single actuation.

Figure 5:
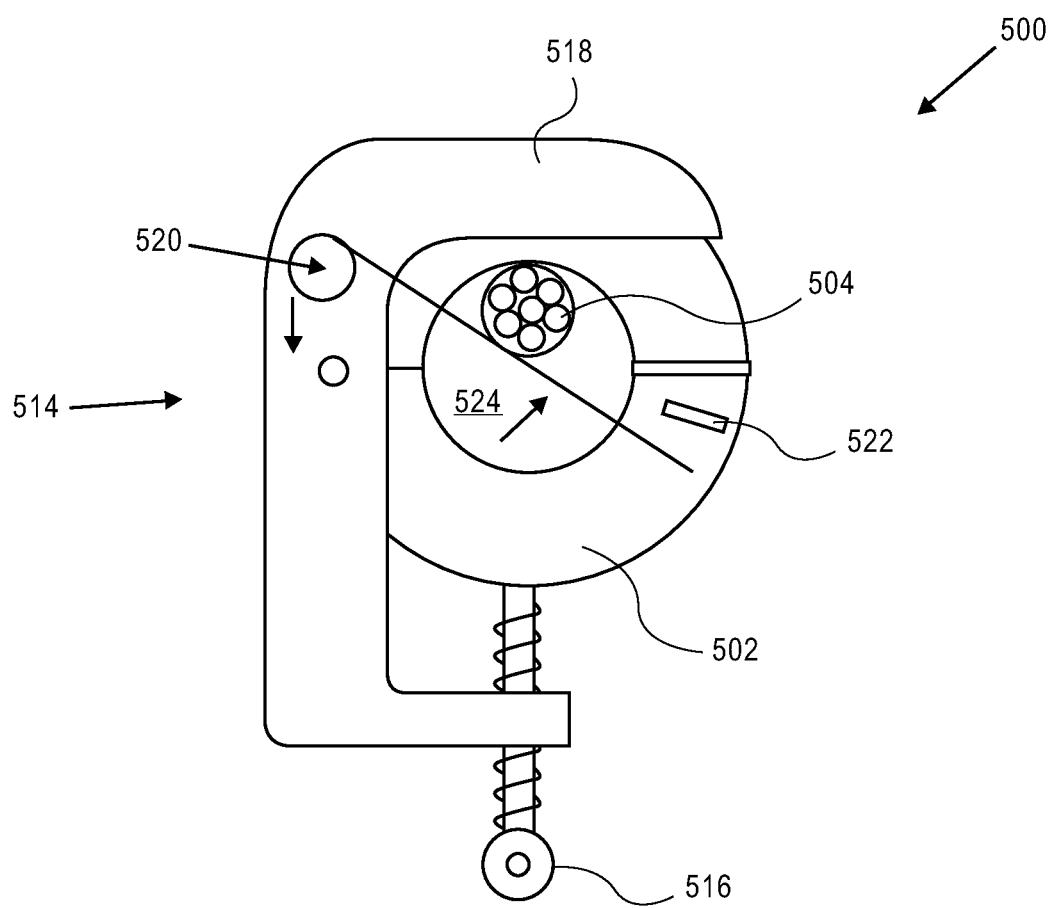
FIG. 5 describes a conductor clamping mechanism with two independent loading elements for core closure/opening and conductor gripping.

FIG. 5 illustrates one embodiment of a clamping mechanism 514 configured to clamp the two halves of a split-core transformer 502 of sensor 500 together. As described above, the split-core transformer of a power line sensor can be configured to harvest energy from a power conductor of a power grid distribution network. In FIG. 5, clamping mechanism 514 can include a single screw clamp 516 and hard stop mechanism 518 sized and configured to clamp around both sides of the split-core transformer. The clamping mechanism 514 can also include a spring 520 configured to span across the split-core transformer to a spring catch 522. The spring can be pre-biased to bend or expand in the direction shown by arrow 524 so as to clamp or press the power line 504 against the split-core transformer 502. It should be understood that FIG. 5 is a schematic drawing illustrating the details of the clamping mechanism. In some embodiments, sensor 500 can include the other elements of the power line sensor described above in FIG. 1.

To deploy the power line sensor 500 shown in FIG. 5, the split-core transformer can first be arranged or placed around the power line 504 while in the open position (e.g., with the two core halves separated wide enough to allow passage of the power line). The lineman or installer can then attach a lineman's tool or "hot-stick" to the screw clamp 516. For example, the screw clamp 516 can include an opening or eyelet configured to attach to the hot-stick. Next, the screw 516 can be rotated and tightened against the split-core transformer by rotating the lineman's tool, so as to apply pressure between the screw and the hard stop mechanism 518 to clamp both core halves of the split-core transformer together. Finally, the spring 520 can be arranged next to the power line so that the spring is biased to apply pressure onto the power line to press the power line into contact with the split-core transformer. This method provides for installation of a split-core power harvesting power line sensor with a single "hot-stick".

It should be understood that the power line sensor 500 is illustrated in FIG. 5 with some features not shown, for ease of illustration. In addition to the illustrated components, the power line sensor can also include a hermetic housing and electronics necessary for the complete functionality of the power line sensor, as described above in reference to FIG. 1.

Figure 6B:
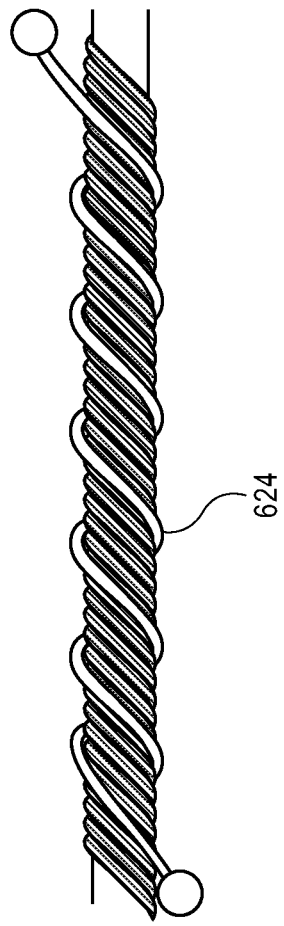
FIGS. 6A-6B describe a sleeve wrap structure for use on conductors of small diameter.
Figure 6A:
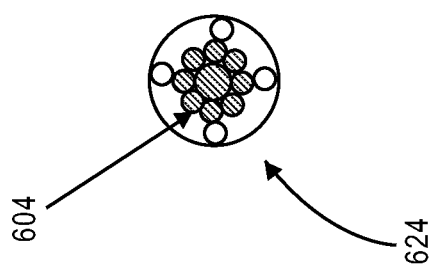

Power line diameters can vary, which can create mounting challenges for power line sensors. Very small conductors can be difficult to grip due to limited surface area for contact. To remedy this issue, in some embodiments wraps or fittings can be installed on or around the power line to increase the diameter of the conductor, and therefore make it easier to mount a power line sensor. One example of a conductor wrap is a set of pre-formed helical aluminum strands which can be wrapped over a conductor in place, effectively increasing the conductor diameter in a given location. Polymer wraps can also be applied to the power line. FIG. 6A illustrates a cross-sectional view of a power line 604 with a wrap 624 surrounding the conductor so as to increase a diameter of the conductor. FIG. 6B shows a side view of the wrap 624 twisting around the power line. The conductor wrap increases the surface area contact for grip while not impairing the magnetic harvesting capability of the split transformer.

Figure 7:
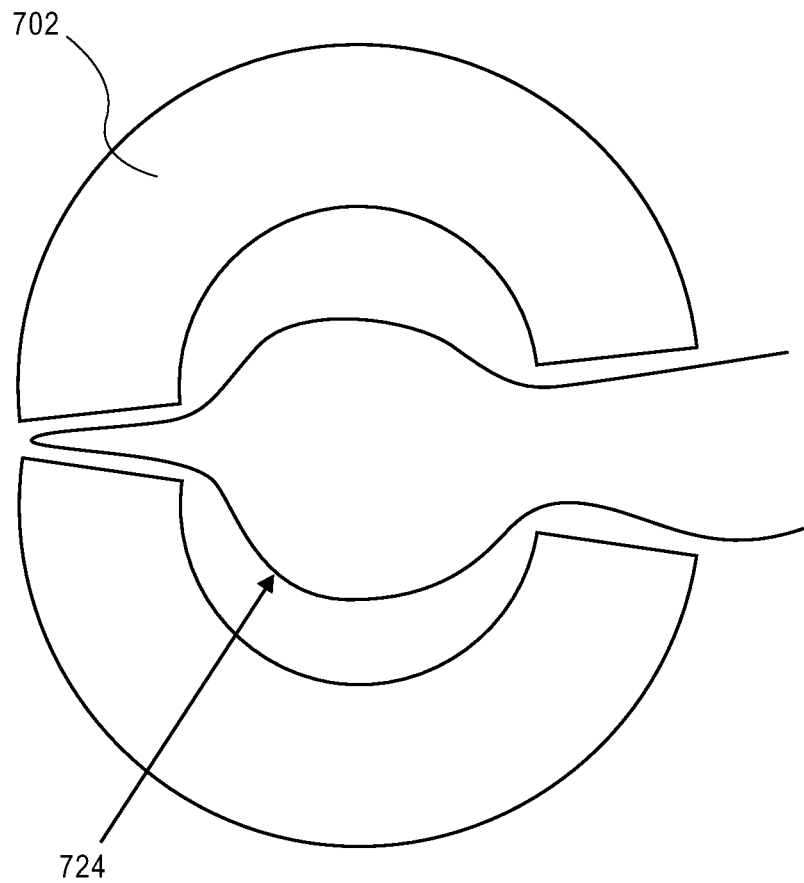
FIG. 7 describes the basic form of a removable protective film on exposed cut core faces.

Another problem facing split-core transformers is that the polished faces of the cores may collect debris in handling and shipment, prior to installation on a conductor. According to the embodiment of FIG. 7, buildup of contaminants on the core faces can be reduced by shipping power line sensors having a split-core transformer with protective films 726 made of paper or plastic sheeting, which can then be peeled off at time of placement or installation. The protective films can be configured to cover and seal the polished faces of the transformer cores to prevent contaminants from forming or sticking to the opposing faces of the cores. In some embodiments, the protective films can include an adhesive on one side to adhere to the polished faces of the cores.

Figure 8:
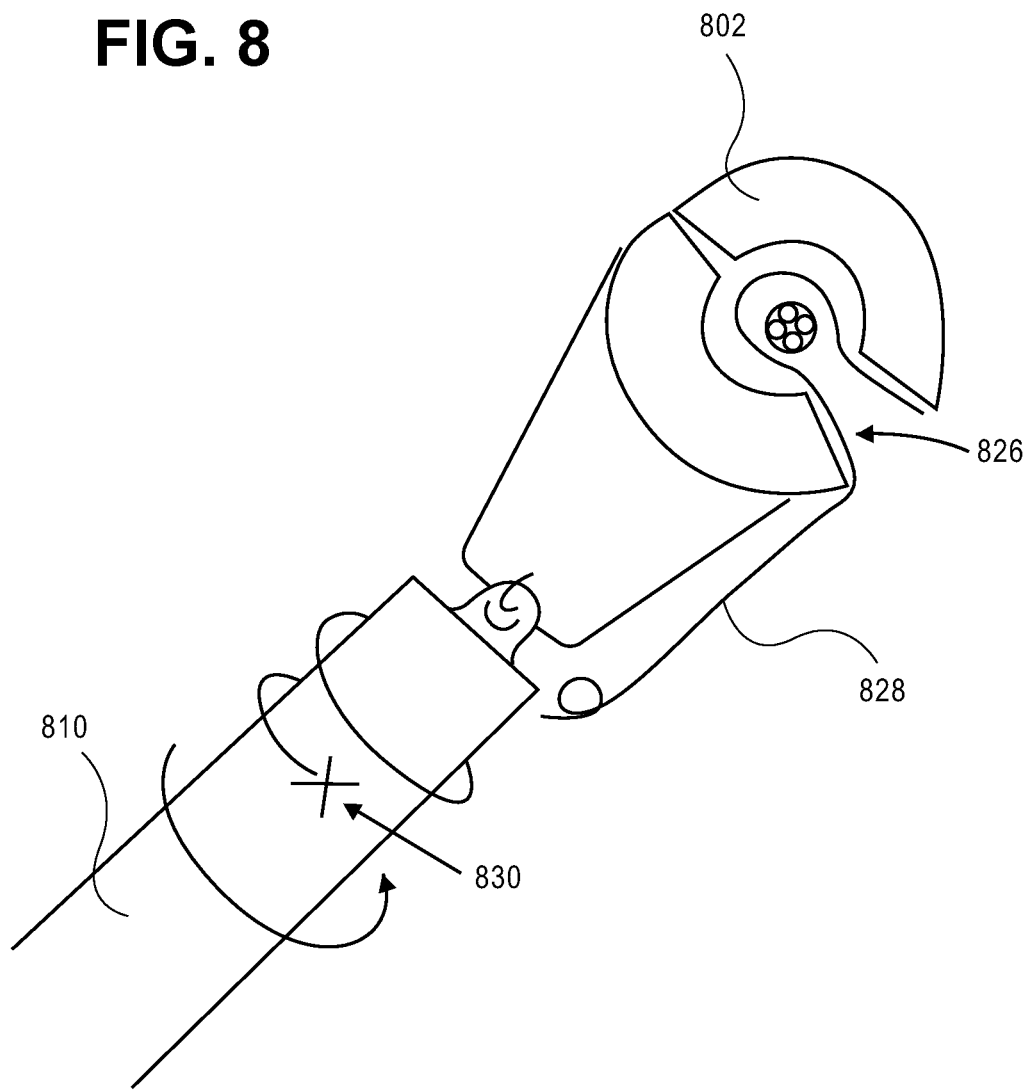
FIG. 8 describes a removable protective film that is automatically removed from the core face through the installation process after placement on the conductor.

In one embodiment, the face protective film can be removed automatically at time of placement through mechanisms of various forms that are actuated by the placement of the split-core transformer or core clamping action. One embodiment, shown in FIG. 8, the placement of the power line sensor over the power line combined with a rotational action of screw closure can be used to wind up the removable tape. Referring to FIG. 8, the power line sensor 800 can be mounted on a hot stick 810. A proximal portion of the protective film 826 can be threaded through a guide 828 (e.g., a guide wire, a string, thread, rope, etc.) and attached to the hot stick at attachment point 830 to be used to attach the sensor to a power line. As the hot stick is rotated to clamp the split-core transformers around the line, the winding action of the hot stick can pull the guide 828, and thus the protective film 826, from the faces of the transformer cores.

Figure 9:
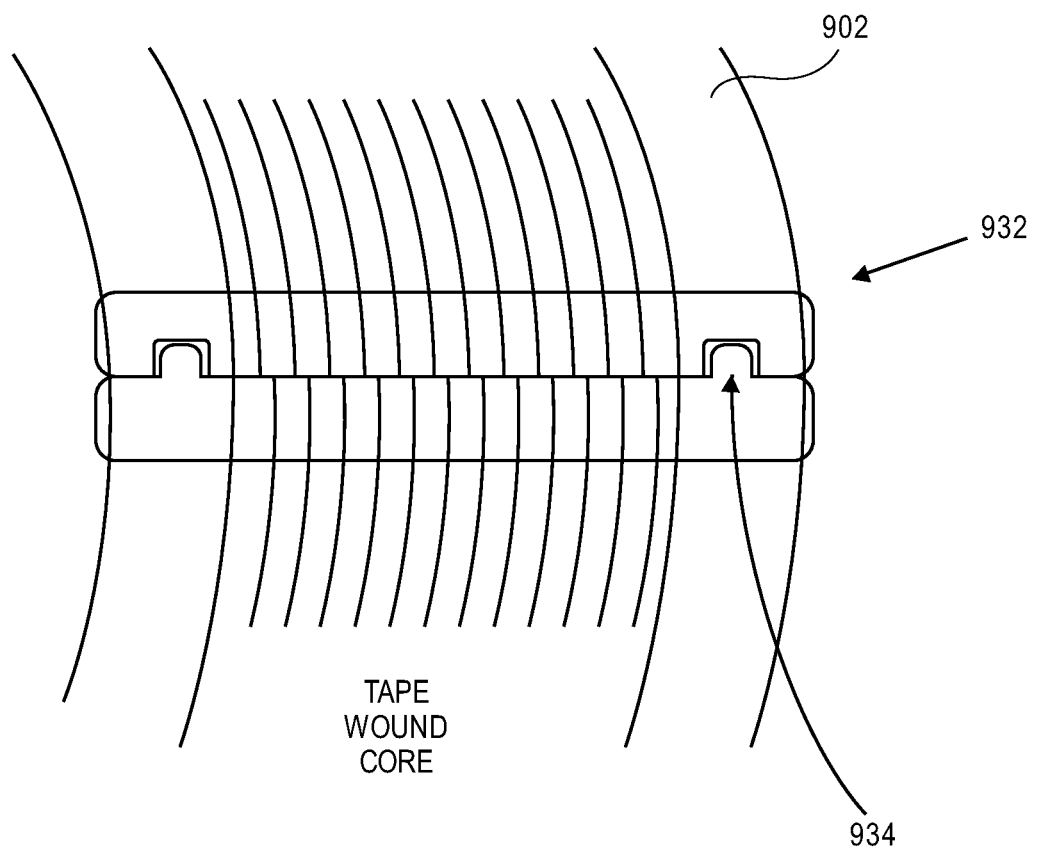
FIG. 9 describes the basic form of a closure mechanism loaded perimeter seal.

Sealing of polished faces can maintain a clean and dry environment for the cores and is critical for long term reliability. It is important to note that it is not possible to provide useful sealing around the conductor itself as all but the smallest diameter conductors are multi-stranded and therefore can carry water along their lengths. Instead, each mating core face perimeter must be sealed independently. FIG. 9 shows one embodiment of a split-core transformer 902 having a perimeter seal 932 around the perimeter of each split-core face. For example, the perimeter seal 930 can include a first seal 932a on one split-core face and a second seal 932b on the other split-core face. The first and second seals can also have an o-ring feature 934, for example, to further seal the core faces. Numerous embodiments of a perimeter seal are possible including static o-ring seals, semi-permanent low strength adhesive seals, and sealing gels such as Dow Corning gel sealing pads. In the embodiment of FIG. 9, the seals encircle the entire perimeter of the core face perimeter, including on both the exterior of the perimeter as well as the interior of the perimeter near the conductor.

Less than hermetic sealing can be expected from static o-rings and gaskets, which then leave the core face gap exposed to migration of moisture through capillary action. Filling the gap with a sealing material such as fluid, wax, or paste that only fills the gap and does not increase it is useful to preclude wicking of moisture into the core face. Numerous embodiments of gap filling are practical including simple oil application prior to closure or thin wax like coatings that extrude out over time to leave material only at voids.

Figure 10B:
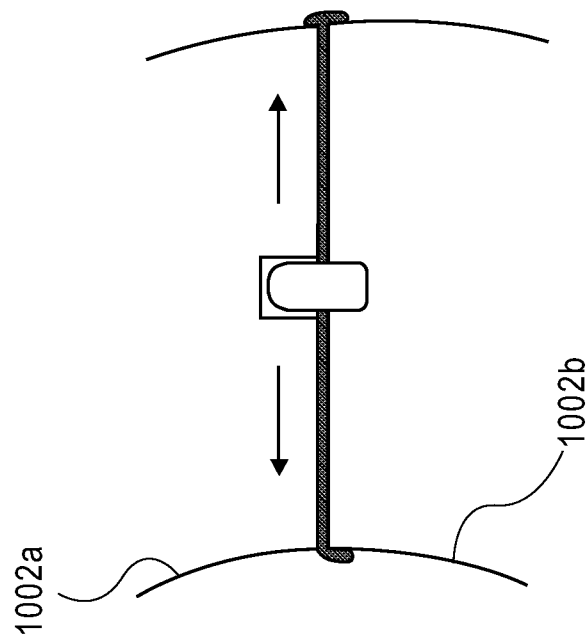
FIGS. 10A-10B describe the basic form of a closure actuated core face protective oil pump within the perimeter seal.
Figure 10A:
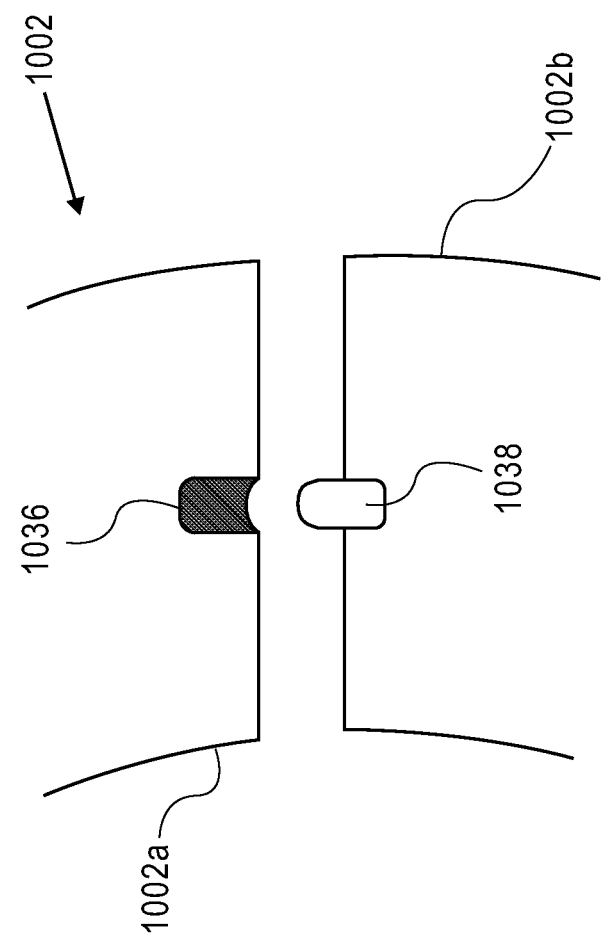

One embodiment of gap filling keeps the gap filling material away from contact with debris until the cores of a split-core transformer are closed. FIGS. 10A-10B show one embodiment where the gap filler is held in a small reservoir within the sealed face zone and is forced into the gap during core closure by a small displacement pin. Referring to FIG. 10A, first core 1002a can include a reservoir 1036, and second core 1002b can include a tab or pin 1038 sized and configured to fit into the reservoir. The reservoir can be filled with a sealing material as described above, such as a fluid, wax, or paste. The sealing material can be temporarily sealed into the reservoir, and the pin can be configured to puncture a seal of the reservoir to release the sealing material when the split-core transformer is closed around a power line conductor. Referring to FIG. 10B, as the two core halves are pressed together when the split-core transformer is closed around a power line, the displacement pin can break or puncture a sealed face zone and extend into the reservoir, allowing the reservoir to release the sealing fluid, paste, or wax onto the two faces of the split-core transformer. The fluid, paste, or wax can then coat the faces of the transformers to hermetically seal the transformers.

Figure 11:
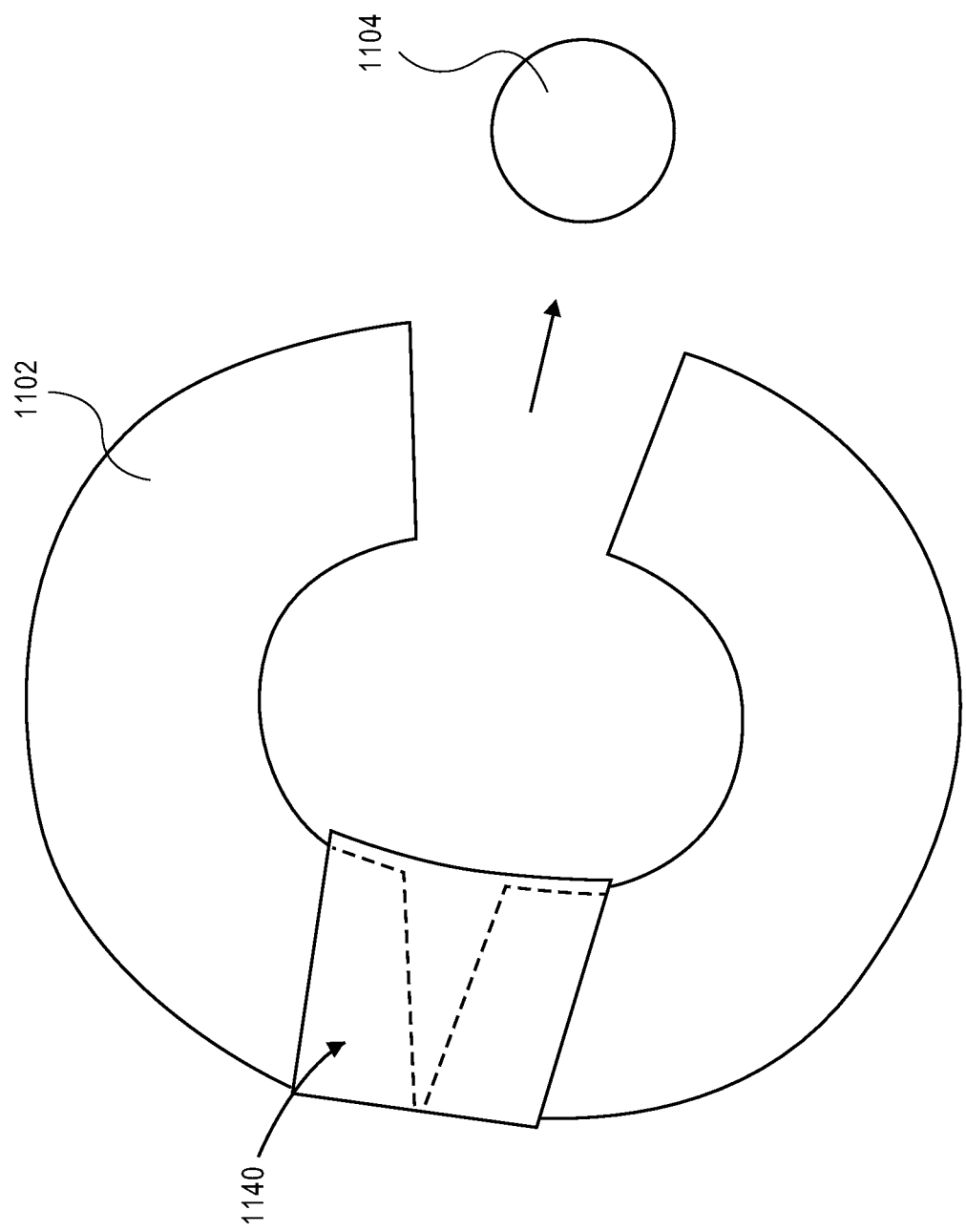
FIG. 11 describes a protective seal to eliminate core face contamination at the hinged core interface.

In another embodiment, one of the core faces of a split-core transformer can be arranged for limited motion if the assembly is hinged at one side. The other, larger opening is then used to place around the power line 1104 as shown in FIG. 11. The hinged face can be largely protected from contamination during placement if a shield or flexible boot 1140 is applied around the gap as shown in FIG. 11. Hermetically sealing the hinged side of the transformers reduces the number of places that contamination can damage the joining of the transformer cores.

Figure 12:
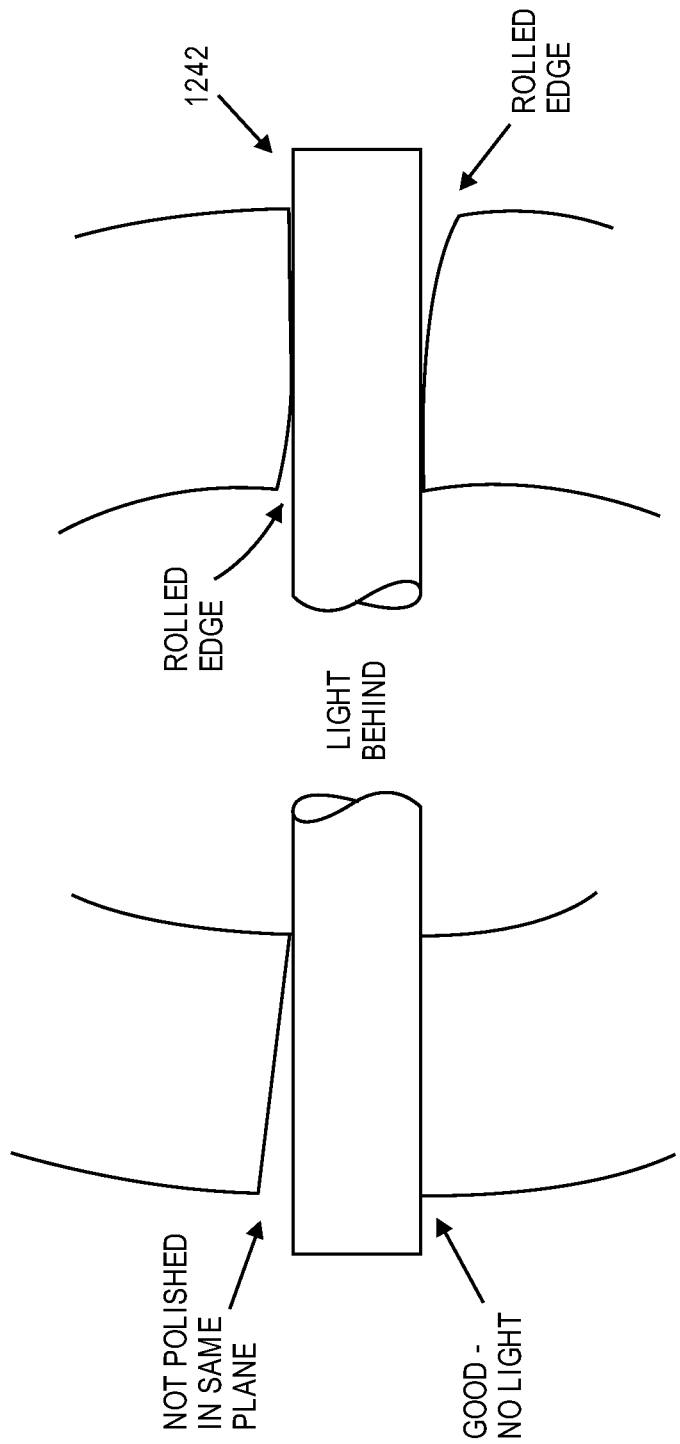
FIG. 12 describes a split-core face gap inspection tool.

Referring now to FIG. 12, the manufacturing process of split-cores may include a lapping process which planarizes the faces and polishes out voids. If this step is executed well on both core halves, then good planar contact will result between the split-core halves at the core temperature conditions during the planarization process. If the lapping or planarization process is less precise, the faces will not mate well and magnetic performance suffers. Operating the split-core at temperatures above and below the polishing temperature will also result in planarization issues. In FIG. 12, test device 1242 comprising of a precision ground rod and a backlight source (not shown) was developed to evaluate face planarity. The light can be shown through the core faces and the test device to determine if the core halves are properly polished. Light shining between the core face and the test device can indicate, for example, core halves not polished in the same plane, or core faces having rolled edges, as shown. This test device has been shown to readily detect planarity errors of less than 0.001" on 3.5" OD cores. FIGS. 13A, 13B, and 13C describe the face contact of a typical core at cold temperatures (approximately −50 degrees C.), polishing temperature (approximately room temperature), and warmer temperatures (approximately 50 degrees C.), respectively.

Figure 14:
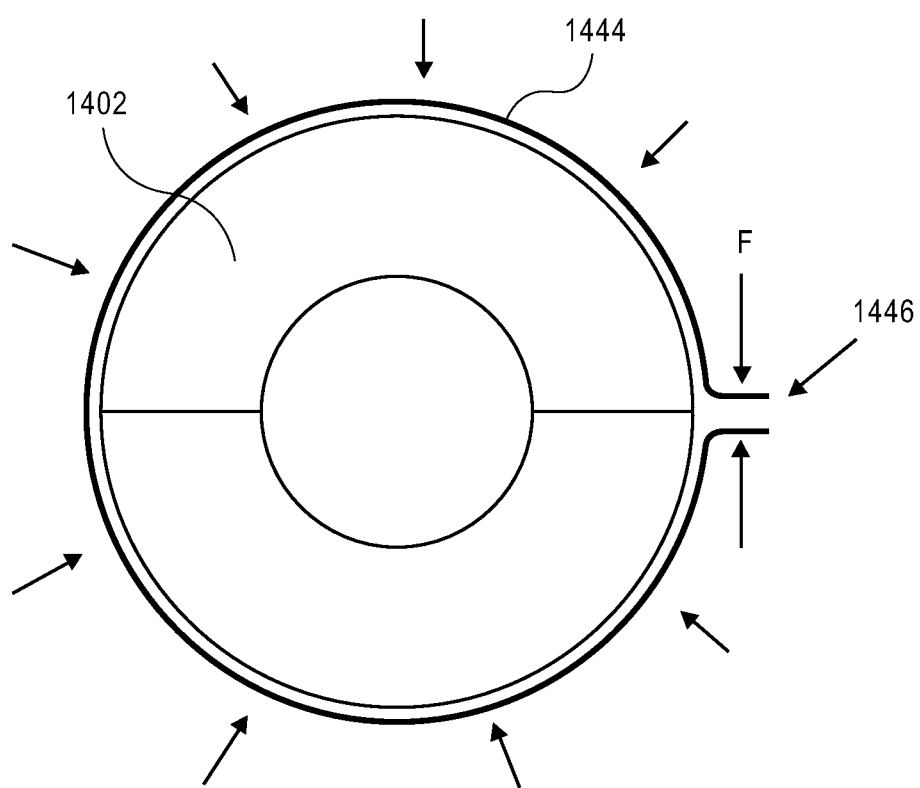
FIG. 14 describes a clamping strap which applies even compressive load evenly around the core perimeter vs. a point loaded clamp.

FIG. 14 illustrates another embodiment of a clamp 1444 configured to reduce the effects of planarization errors in a split-core transformer. As shown in FIG. 14, claim 1444 can comprise a band clamp that can be wrapped around an external perimeter of split-core transformer 1402 of a power line sensor. Applying force F to the opening 1446 of the clamp 1444 on a core with planarization errors due to polishing or temperature can reduce closure loads if the loading is similar to the band clamp as shown in FIG. 14. As shown by the arrows in FIG. 15, this type of clamp can apply forces to the entire perimeter of the split-core transformer. In contrast, point loading from a conventional simple clamp can aggravate the gap error and possibly delaminate the core. In some situations, this embodiment including the band clamp can also include the spring (shown in FIG. 5) to aid in pressing the power line conductor against the split-core transformer.

Figure 15:
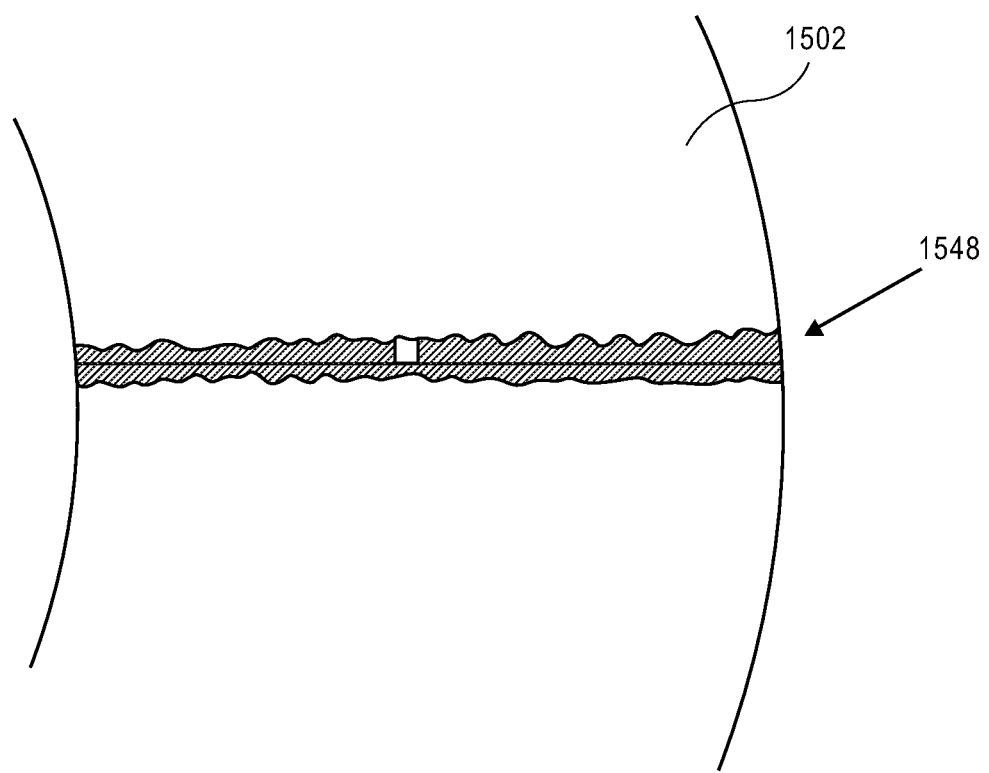
FIG. 15 describes a thin polymer coating on the polished face of a split-core transformer.

The core face itself can be protected from corrosion through various methods. For example, the faces of a split-core transformer 1502 can be coated with a thin protective layer such as a thin vapor deposited polymer 1548 as shown in FIG. 15. One example of a vapor deposited polymer is commercially available Parylene. For the best protection, such a layer must be pinhole free, a difficult to achieve goal.

Figure 16:
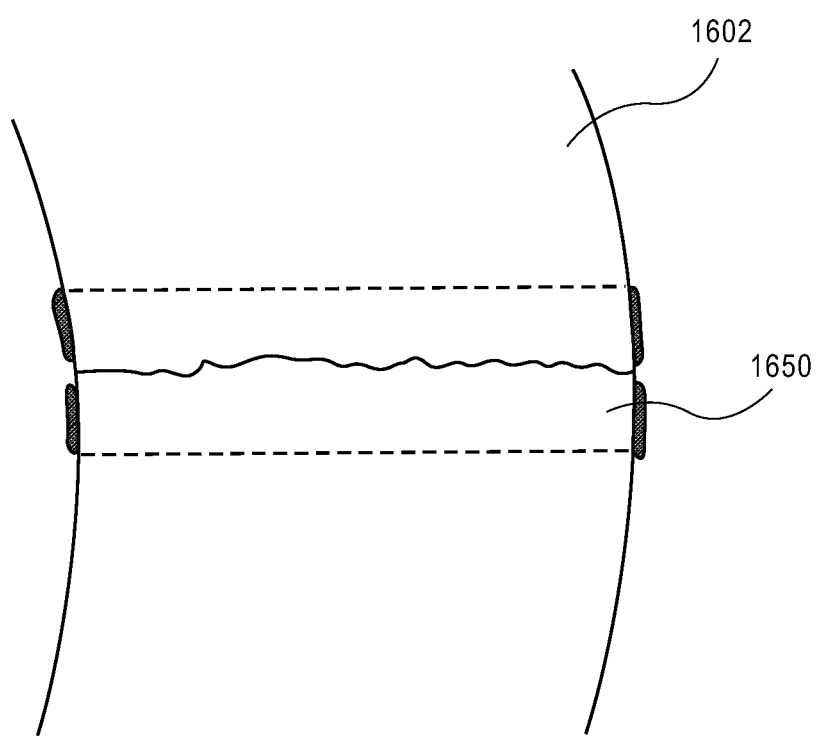
FIG. 16 describes a sacrificial metal coating on the core outer surfaces.
Figure 17:
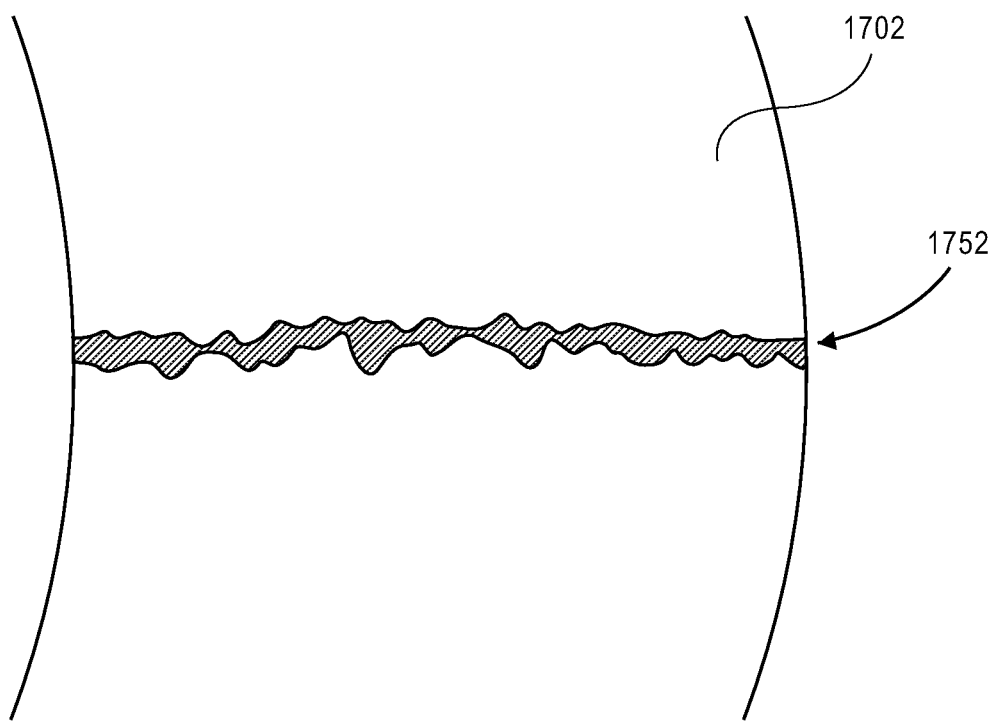
FIG. 17 describes a thin metal coating with good magnetic properties and good corrosion resistance on the core face which fills face voids.
Figure 18:
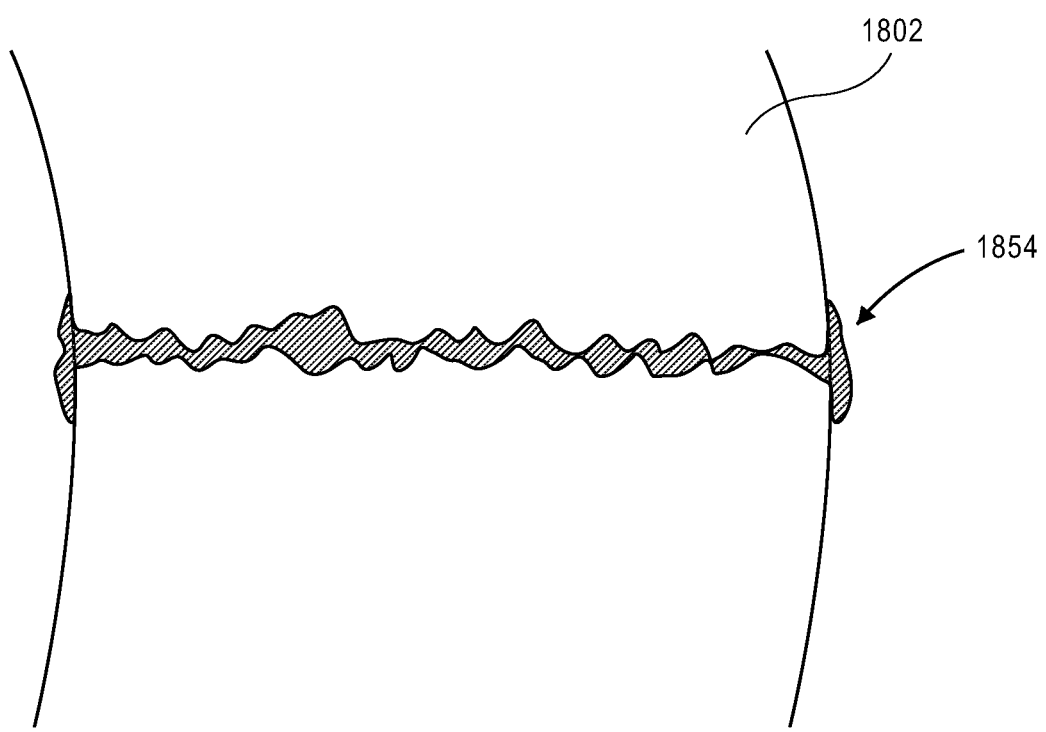
FIG. 18 describes a core face gap filled with magnetic ferro fluid which provides protection from moisture and improves magnetic coupling.

The face can also be coated with a very thin sacrificial metal coating such as nickel or zinc. If applied sufficiently thin (1 to 5 micrometers), the metallic layer will not affect the magnetic performance substantially. Sacrificial coatings should be pinhole free to be effective corrosion barriers. A sacrificial metal 1650 can be applied outside of the seal area of a split-core transformer 1602 in galvanic contact with the core material in a fashion similar to zinc anodes on a boat hull, shown in FIG. 16. Similarly, a thin metallic coating 1752 with good magnetic properties can also fill face voids in a split-core transformer 1702, as shown in FIG. 17, improving magnetic performance. The gap of a split-core transformer 1802 can also be filled with a ferro-fluid 1854, which can exclude moisture from filling the gap and can improve magnetic coupling between the core faces, shown in FIG. 18.

Figure 19:
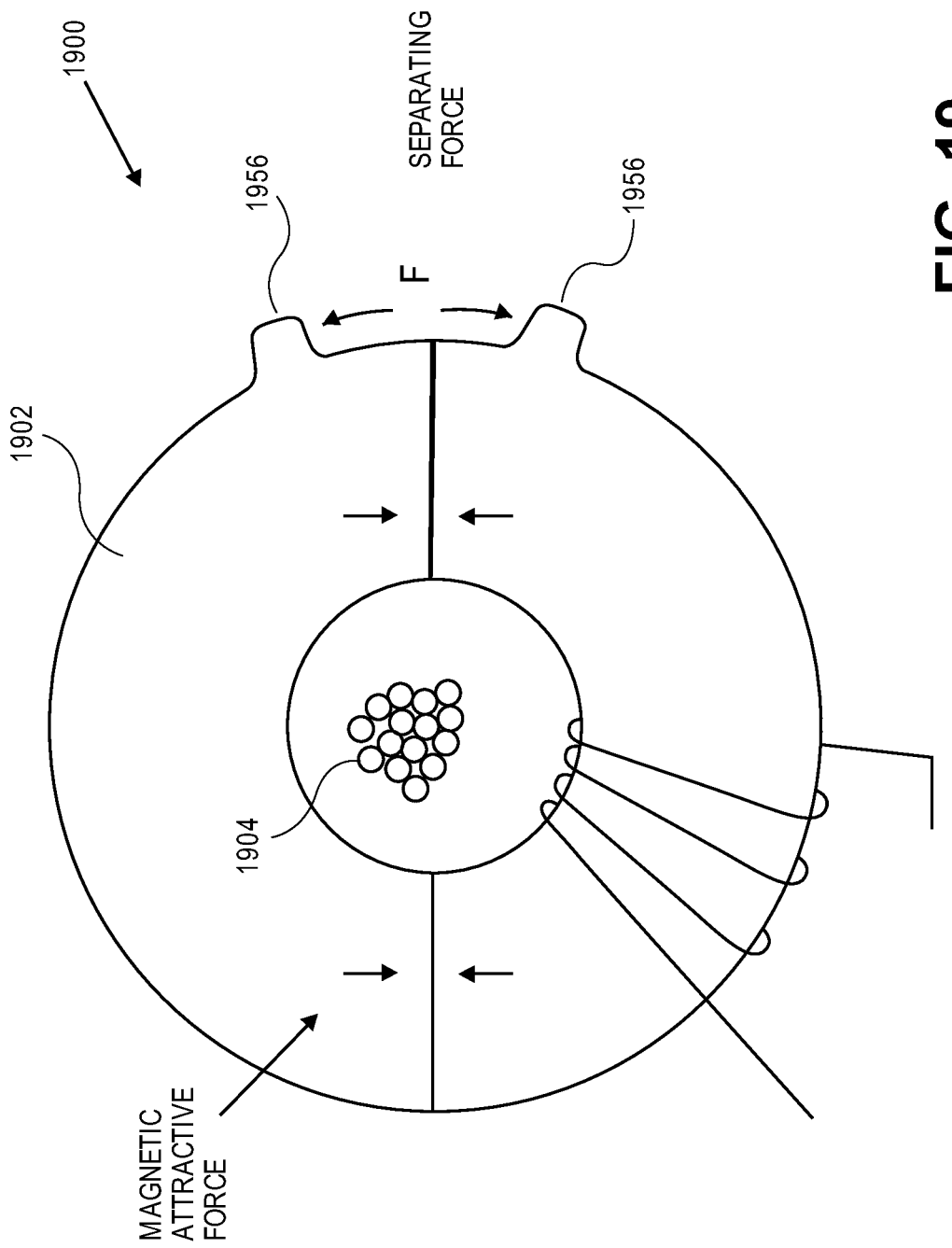
FIG. 19 illustrates the mechanical load on the clamp structure necessary to separate a split-core under high line current.

Referring now to FIG. 19, line sensors with magnetic field energy harvesting must be capable of placement on a conductor that is actively carrying current. Similarly, a line sensor 1900 may need to be removed from a power line conductor 1904 carrying current. The clamp structure must therefore be capable of separating the core faces of a split-core transformer 1902 under high magnetic attraction, as shown in FIG. 19. While the magnetic forces can be reduced through active control of the secondary windings, it can reasonably be assumed that those capabilities are not present on a device slated for removal as it may have failed in the field. In some situations, the separation forces required to remove a split-core line sensor from an active conductor can be on the order of hundreds of pounds. The core, the windings, and clamp structure must be capable of accommodating these loads within the use of a continuous metal strap around the core at any location, such as a conductive loop representing an additional single turn secondary winding. Additional complications include accommodating thermal loads due to power dissipation of the core under various operating conditions and UV stresses which can degrade many polymers over time. In some embodiments, mechanical features 1956 can be included on an exterior of the split-core transformer to provide a leverage point for mechanical removal of the sensor.

Figure 20:
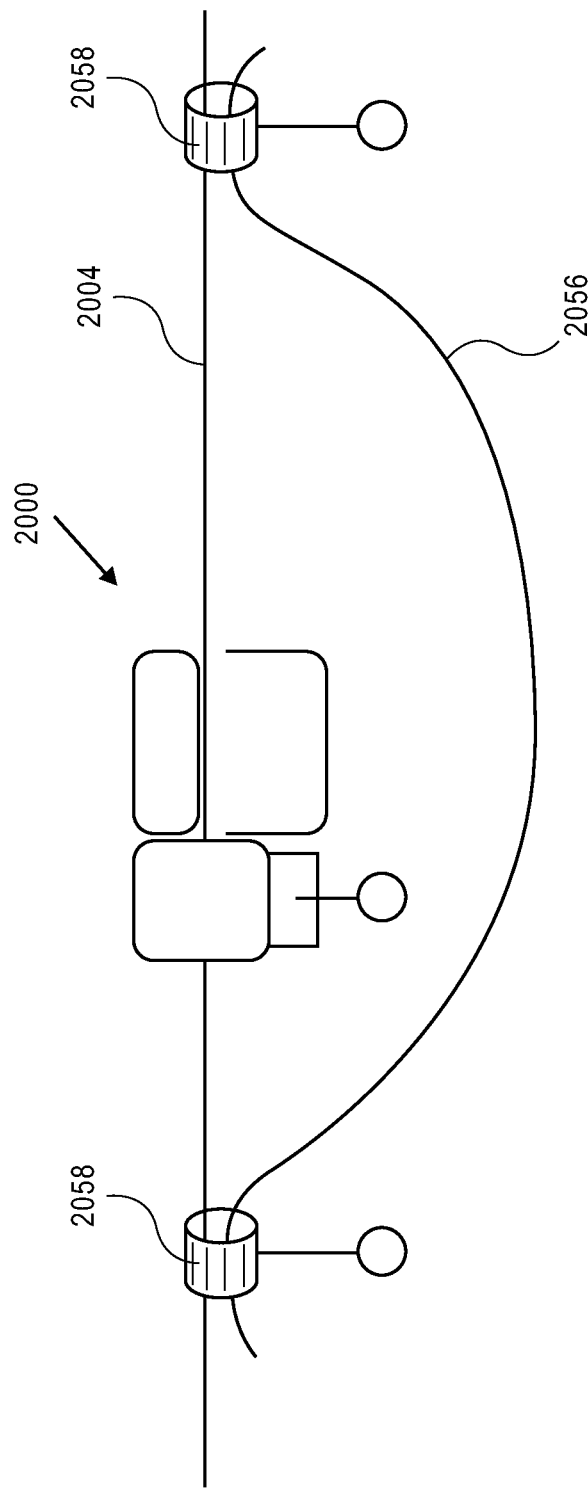
FIG. 20 describes one method of core removal under high line current if the mechanical clamp structure is unable to overcome the separation force.

Under certain circumstances, it may be beneficial to dramatically reduce the effectiveness of the core for removal. In one embodiment, referring to FIG. 20, a high conductance path 2056 can be placed onto the power line conductor on both sides of the power line sensor 2000. Doing so creates a shorted electrical path around the split-core transformer of the power line sensor. This shorted turn can create a back EMF that prevents magnetic flux build up and energy harvesting, which can therefore aid in the removal of the sensor from the power line. In some embodiments, the conductance path 2056 can comprise a metal conductor wire, which can be attached to the power line conductor 2004 with clamps 2058.

Figure 21:
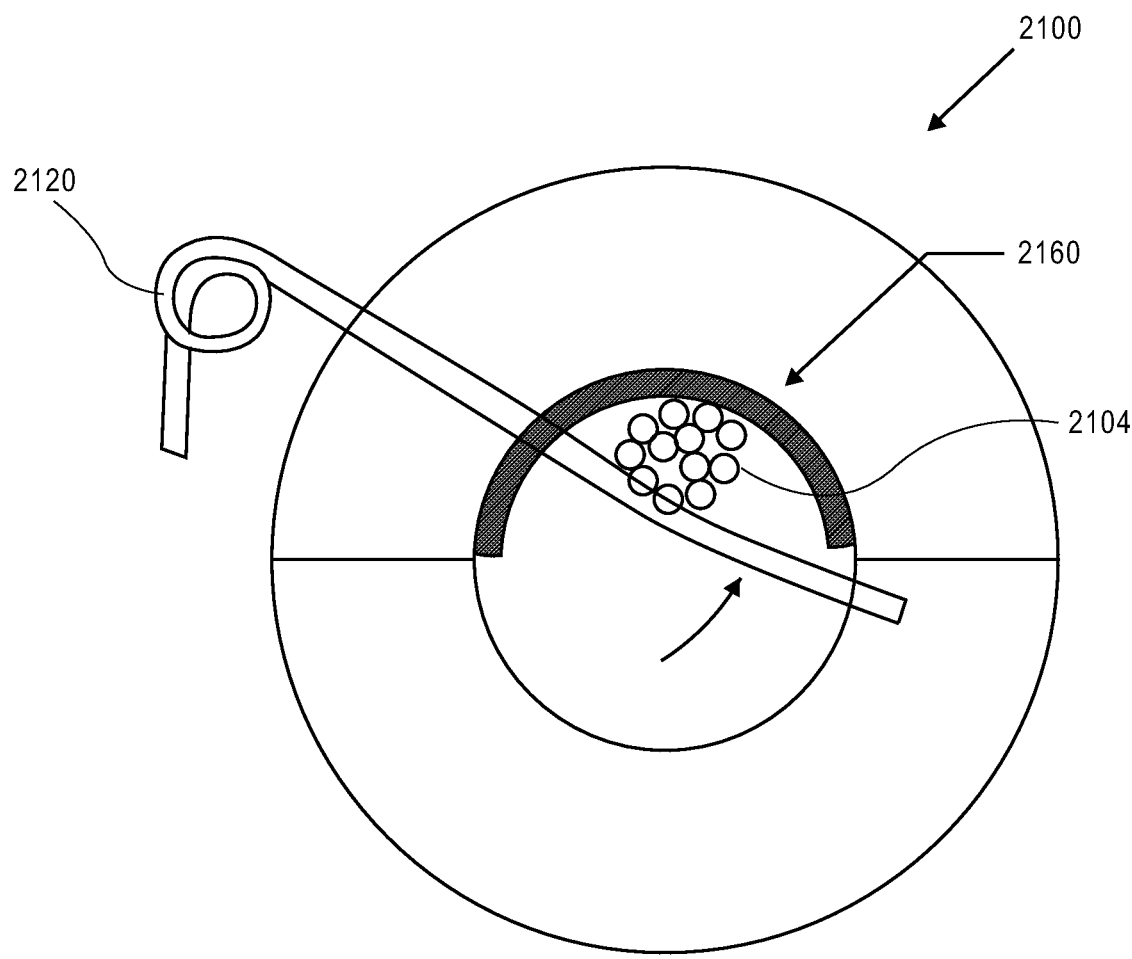
FIG. 21 describes an elastomeric gripping pad applied to the power harvest core for resistance to rotation and translation on the line against wind and vibration loads.

Referring now to FIG. 21, in some embodiments the gripping force of a power line sensor 2100 to the power line conductor 2104 can be increased to avoid rotation of the sensor on the line and translation of the sensor down the line. In one embodiment, an elastomeric grip pad 2160 can be added to the power line sensor or the power line conductor to increase the friction between the power line conductor and the power line sensor. A spring 2120 (similar to the spring 520 of FIG. 5) can impart pressure on the power line conductor into the elastomeric grip pad to press the power line sensor firmly onto the conductor, as indicated by the arrow in FIG. 21.

Figure 22:
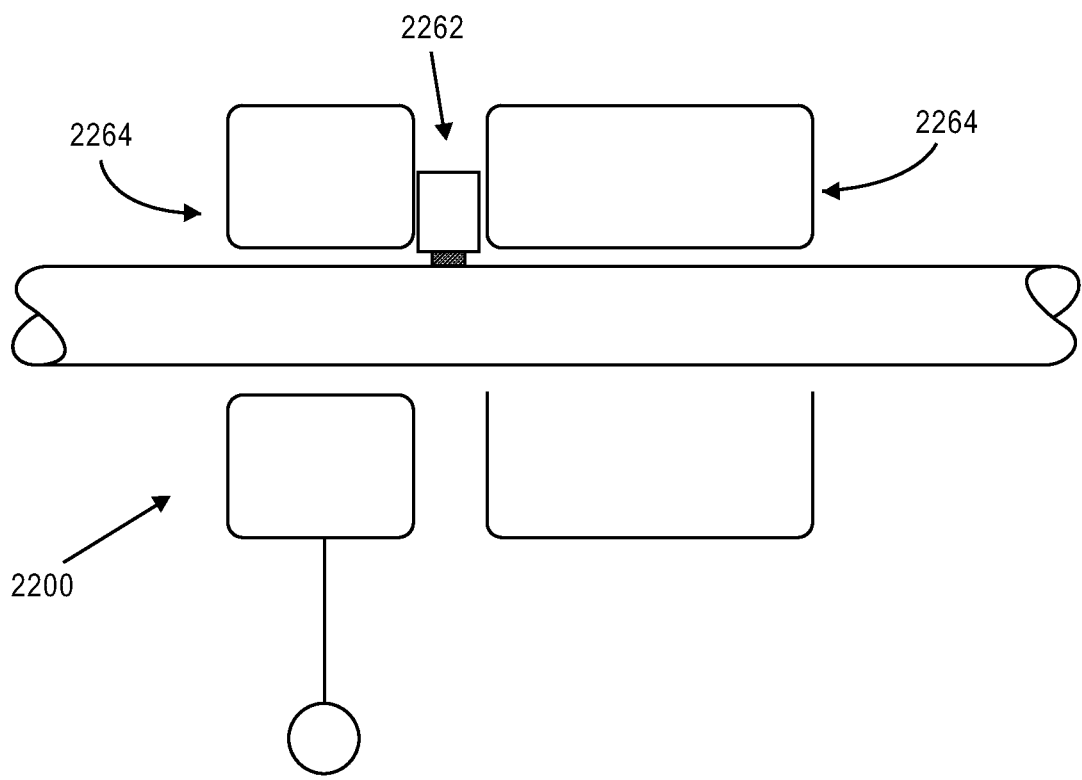
FIG. 22 describes a conductive pad integrated into the clamp and housing structure for single point electrical contact.

Fundamentally, the line mounted sensor is not electrically grounded. However, there can be a benefit to providing a single point electrical contact between the electronics of the power line sensor and the power line conductor, especially under faulted line conditions. One embodiment of an electrical contact 2262 is shown between a power line sensor 2200 and a power line conductor 2204 in FIG. 22. The electrical contact 2262 can be separated from other conductors in the sensor by insulating material 2264, for example. In some embodiments, the electrical contact can comprise a conductive plate or pad which is integrated into a housing or clamp of the power line sensor and is the only conductive path into the sensor.

What is claimed is:

1. A power line sensing device, comprising:
   a split-core transformer comprising a first core half having a first core face and a second core half having a second core face;
   a clamping mechanism that, when the power line sensing device is installed, joins the first core face to the second core face around a power line conductor;
   a seal positioned between the first core face and the second core face; and
   a sacrificial metal applied outside of the seal and in galvanic contact with material of the split-core transformer.

2. The power line sensing device of claim 1, the power line sensing device further comprising electronics configured to receive energy harvested from the split-core transformer to power the power line sensing device.

3. The power line sensing device of claim 1, further comprising a grip pad disposed on an interior of the split-core transformer, the grip pad configured to increase friction between the split-core transformer and the power line conductor.

4. The power line sensing device of claim 1, the seal comprising a first seal and a second seal each independently sealing the first core face and the second core face, respectively.

5. The power line sensing device of claim 1, further comprising an o-ring or gasket providing an additional seal around a perimeter of the first core face and the second core face.

6. The power line sensing device of claim 1, the seal being an adhesive seal.

7. The power line sensing device of claim 1, the seal being a gel.

8. The power line sensing device of claim 1, the seal being a fluid.

9. The power line sensing device of claim 1, the seal being a wax.

10. The power line sensing device of claim 1, the seal being a ferro-fluid.

11. The power line sensing device of claim 1, the seal filling one or more voids between the first core face and the second core face.

12. A power line sensing device, comprising:
    a split-core transformer comprising a first core half having a first core face and a second core half having a second core face;
    a hinge attached to one adjoining side of the first core half and the second core half, the hinge being sealed, the hinge being sealed via a flexible boot applied around a gap between the first core half and the second core half; and
    a clamping mechanism that, when the power line sensing device is installed, joins the first core face to the second core face around a power line conductor.

13. The power line sensing device of claim 12, the power line sensing device further comprising electronics configured to receive energy harvested from the split-core transformer to power the power line sensing device.

14. The power line sensing device of claim 12, further comprising a seal positioned between the first core face and the second core face.

15. The power line sensing device of claim 14, the seal comprising a first seal and a second seal each independently sealing the first core face and the second core face, respectively.

16. The power line sensing device of claim 14, further comprising an o-ring or gasket providing an additional seal around a perimeter of the first core face and the second core face.

17. The power line sensing device of claim 14, the seal being an adhesive seal.

18. The power line sensing device of claim 14, the seal being selected from a group of materials consisting of a gel, a fluid, a wax, and a ferro-fluid.

19. A power line sensing device, comprising:
a split-core transformer comprising a first core half having a first core face and a second core half having a second core face;
a clamping mechanism that, when the power line sensing device is installed, joins the first core face to the second core face around a power line conductor;
a seal positioned between the first core face and the second core face;
a grip pad disposed on an interior of the split-core transformer, the grip pad configured to increase friction between the split-core transformer and the power line conductor; and
a spring configured to push the power line conductor into the grip pad.

20. The power line sensing device of claim 19, the grip pad being an elastomeric grip pad.

* * * * *